US009104196B2

(12) United States Patent  
Koyama et al.

(10) Patent No.: US 9,104,196 B2
(45) Date of Patent: Aug. 11, 2015

(54) SUBSTRATE PROCESSING SYSTEM AND GROUP MANAGING APPARATUS

(75) Inventors: Yoshitaka Koyama, Oyabe (JP); Hiroyuki Iwakura, Toyama (JP); Yasuhiro Joho, Nanto (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 13/576,537

(22) PCT Filed: Feb. 8, 2011

(86) PCT No.: PCT/JP2011/052567
§ 371 (c)(1), (2), (4) Date: Aug. 21, 2012

(87) PCT Pub. No.: WO2011/099458
PCT Pub. Date: Aug. 18, 2011

(65) Prior Publication Data
US 2012/0323855 A1 Dec. 20, 2012

(30) Foreign Application Priority Data

Feb. 9, 2010 (JP) ................................. 2010-026883

(51) Int. Cl.
*G06F 7/00* (2006.01)
*G05B 19/418* (2006.01)
(Continued)

(52) U.S. Cl.
CPC ...... *G05B 19/41875* (2013.01); *G05B 2219/32221* (2013.01); *G05B 2219/45031* (2013.01); *H01L 21/67109* (2013.01); *H01L 21/67276* (2013.01); *H01L 21/67769* (2013.01)

(58) Field of Classification Search
None
See application file for complete search history.

(56) References Cited

U.S. PATENT DOCUMENTS

2005/0033724 A1* 2/2005 Antognini et al. ............. 707/1
2006/0047930 A1 3/2006 Takahashi et al.
(Continued)

FOREIGN PATENT DOCUMENTS

JP A-2004-027646 1/2004
JP A-2006-350599 12/2006
(Continued)

OTHER PUBLICATIONS

Japanese Office Action issued in Application No. 2011-553834; Dated Jul. 30, 2013 (With Translation).
(Continued)

*Primary Examiner* — Etienne Leroux
*Assistant Examiner* — Thu Nga Nguyen
(74) *Attorney, Agent, or Firm* — Oliff PLC

(57) ABSTRACT

There is provided a communication unit configured to receive monitor data showing a progress state of substrate processing or a state of substrate processing apparatus, from a substrate processing apparatus; a database part configured to readably store the monitor data received by the communication unit, in association with production information data; a file archive part configured to read the monitor data and the production information data from the database part, then create typical value data based on the monitor data, and prepare a file including the monitor data, the production information data, and the typical value data, and readably store this file; and a data searching part configured to receive an input of a prescribed searching condition to search the file, and display data stored in the file and matching with the searching condition, on a display unit.

13 Claims, 13 Drawing Sheets

(51) Int. Cl.
 *H01L 21/67* (2006.01)
 *H01L 21/677* (2006.01)

(56) References Cited

U.S. PATENT DOCUMENTS

| | | | |
|---|---|---|---|
| 2006/0288048 | A1 | 12/2006 | Kamohara et al. |
| 2007/0106710 | A1 | 5/2007 | Haustein et al. |
| 2008/0243296 | A1 | 10/2008 | Asai et al. |
| 2008/0311688 | A1* | 12/2008 | Yamashita et al. ............ 438/14 |
| 2009/0265027 | A1 | 10/2009 | Takahashi et al. |
| 2010/0152887 | A1* | 6/2010 | Kawasaki .................. 700/228 |
| 2010/0214296 | A1 | 8/2010 | Kawamura |

FOREIGN PATENT DOCUMENTS

| | | |
|---|---|---|
| JP | A-2006-351667 | 12/2006 |
| JP | A-2007-109262 | 4/2007 |
| JP | A-2007-122716 | 5/2007 |
| JP | A-2008-034769 | 2/2008 |
| JP | A-2008-085229 | 4/2008 |
| JP | A-2009-026993 | 2/2009 |
| JP | A-2009-081450 | 4/2009 |
| JP | A-2009-290158 | 12/2009 |
| JP | A-2010-027646 | 2/2010 |
| TW | 200848964 A | 12/2008 |
| WO | WO 2008/146736 A1 | 12/2008 |

OTHER PUBLICATIONS

International Search Report issued in Application No. PCT/JP2011/052567; Dated May 10, 2011 (With Translation).

May 16, 2014 Office Action issued in Taiwanese Patent Application No. 100103023 (with translation).

Oct. 27, 2013 Office Action issued in Korean Patent Application No. 10-2012-7016060 (with translation).

* cited by examiner

FIG. 5

| No | DATA ITEM | STATEMENT |
|---|---|---|
| 1 | NAME OF TYPICAL VALUE | NAME OF TYPICAL VALUE |
| 2 | EXTRACTING CONDITION OF TYPICAL VALUE | TYPICAL VALUE CALCULATING CONDITION SUCH AS AVERAGE, MAXIMUM, MINIMUM, AND STANDARD DEVIATION |
| 3 | TYPICAL VALUE EXTRACTING SECTION | SECTION FOR EXTRACTING TYPICAL VALUE (SUCH AS STEP 10 AND STEP DEPO) |
| 4 | TYPICAL VALUE EXTRACTING TIME | START DATE AND END DATE OF ACTURALLY EXTRACTING TYPICAL VALUE |
| 5 | TYPICAL VALUE | TYPICAL VALUE ITSELF |
| 6 | DATE AND TIME OF CREATING TYPICAL VALUE | DATE AND TIME OF CREATING TYPICAL VALUE |
| 7 | CALCULATION TIME OF TYPICAL VALUE | TIME REQUIRED FOR CALCULATING TYPICAL VALUE |
| 8 | NUMBER OF DATA POINT | THE NUMBER OF DATA POINT USED FOR CALCULATING TYPICAL VALUE |
| 9 | TYPICAL VALUE No | NUMBER FOR UNIQUELY IDENTIFYING THE TYPICAL VALUE WHEN A PLURALITY OF SAME TYPICAL VALUES ARE PRESENT IN THE SAME FILE |

SUBSTRATE PROCESSING SYSTEM AND GROUP MANAGING APPARATUS

The present application is based on Japanese Patent Application. No. 2010-026883, filed on Feb. 9, 2010, the entire contents of which are hereby incorporated by reference.

BACKGROUND OF THE INVENTION

1. Technical Field

The present invention relates to a substrate processing system including a substrate processing apparatus that processes a substrate and a group managing apparatus connected to the substrate processing apparatus and the group managing apparatus.

2. Description of the Related Art

There are a plurality of creation spots (called data creation spots hereafter, such as a temperature sensor, a gas flowmeter, and a pressure gauge, etc.) of monitor data (such as time-series data of temperature, gas flow rate, and pressure, etc.) showing a progress state of substrate processing or a state of the substrate processing apparatus, inside of the substrate processing apparatus that repeatedly executes the substrate processing process (batch process) based on a recipe. When there are a plurality of substrate processing apparatuses, a group managing apparatus (a higher-order managing apparatus) connected to a plurality of substrate processing apparatuses is sometimes used for efficiently managing the progress state of substrate processing and the state of a group of the substrate processing apparatuses in an integrated manner. The group managing apparatus is configured to receive the aforementioned data showing the progress state of substrate processing and the state of the substrate processing apparatus, from each substrate processing apparatus, and readably store the received data is readably stored in a database (DB).

SUMMARY OF THE INVENTION

Problem to be Solved by the Invention

When an abnormality occurs inside the substrate processing apparatus and during the substrate processing process, a user or a maintenance staff (also called an operator) of the substrate processing apparatus, operates the group managing apparatus, then analyzes the read data stored in DB, based on a prescribed analysis method, to thereby analyze a generation factor of an abnormal phenomenon (called analysis of abnormality hereafter). However, there is enormous volume of the monitor data stored in the group managing apparatus, thus requiring an experience and labor for extracting necessary information for analysis of abnormality in a proper form. Therefore, the analysis of abnormality can't be performed appropriately or variation is generated in an analysis result in some cases depending on a skill of the operator.

Further, when the enormous volume of monitor data is backed up using an external storage device such as a magnetic tape, in order to refer to the past monitor data, a restoring work of restoring backup data in the group managing apparatus is required, and thus user-friendliness in utilizing data is deteriorated. In addition, even when the database constructed in the group managing apparatus is divided and a part of the database is backed up by the external storage device, etc., the restoring work is also required similarly for referring to the past monitor data, and thus the user-friendliness in utilizing data is deteriorated.

An object of the present invention is to provide a substrate processing system or a group managing apparatus capable of improving user-friendliness at the time of referring to monitor data.

According to a first aspect of the present invention, there is provided a substrate processing system, comprising:

a substrate processing apparatus configured to process a substrate; and a group managing apparatus connected to the substrate processing apparatus, the group managing apparatus comprising:

a communication unit configured to receive from the substrate processing apparatus, monitor data showing a progress state of substrate processing or a state of the substrate processing apparatus;

a database part configured to readably store the monitor data received by the communication unit, in association with production information data;

a file archive part configured to read the monitor data and the production information data from the database part, then create typical value data based on the monitor data, and prepare a file including the monitor data, the production information data, and the typical value data, and readably store the file; and a data searching part configured to receive an input of a prescribed searching condition to search the file, and display data stored in the file and matching with the searching condition on a display unit.

According to a second aspect of the present invention, there is provided a group managing apparatus, comprising:

a communication unit configured to receive a progress state of substrate processing or a state of a substrate processing apparatus, from the substrate processing apparatus;

a database part configured to readably store the monitor data received by the communication unit, in association with production information data;

a file archive part configured to read the monitor data and the production information data from the database part, then create typical value data based on the monitor data, and prepare a file including the monitor data, the production information data, and the typical value data, and readably store this file; and a data searching part configured to receive an input of a prescribed searching condition to search the file, and display data stored in the file and matching with the searching condition on a display unit.

According to third aspect of the present invention, there is provided a substrate processing system, comprising:

a substrate processing apparatus configured to process a substrate; and a group managing apparatus connected to the substrate processing apparatus, the group managing apparatus comprising:

a communication unit configured to receive monitor data showing a progress state of substrate processing or a state of the substrate processing apparatus;

a database part configured to readably store the monitor data received by the communication unit, in association with production information data and definition information data;

a file archive part configured to read the monitor data from the database part in association with the production information data and the definition information data, then create typical value data based on the monitor data, and prepare a file including the monitor data, the production information data, the definition information data and the typical value data, and readably store this file; and a data searching part configured to receive an input of a prescribed searching condition to search the file, and display data stored in the file and matching with the searching condition, on a display unit.

According to a fourth aspect of the present invention, there is provided a substrate processing system, comprising:

a communication unit configured to receive monitor data showing a progress state of substrate processing or a state of a substrate processing apparatus, from the substrate processing apparatus;

a database part configured to readably store the monitor data received by the communication unit, in association with production information data and definition information data;

a file archive part configured to read the monitor data from the database part in association with the production information data and the definition information data, then create typical value data based on the monitor data, and prepare a file including the monitor data, the production information data, the definition information data, and the typical value data, and readably store the file; and a data searching part configured to receive an input of a prescribed searching condition to search the file, and display data stored in the file, and matching with the searching condition on a display unit.

According to the substrate processing system and the group managing apparatus of the present invention, user-friendliness in referring to the monitor data can be improved.

BRIEF DESCRIPTION OF THE DRAWINGS

FIG. 5 is a schematic view showing a structure of a typical value data part according to an embodiment of the present invention.

DETAILED DESCRIPTION OF THE INVENTION

An Embodiment of the Present Invention

An embodiment of the present invention will be described hereafter.

(1) Structure of a Substrate Processing System

Figure 1:
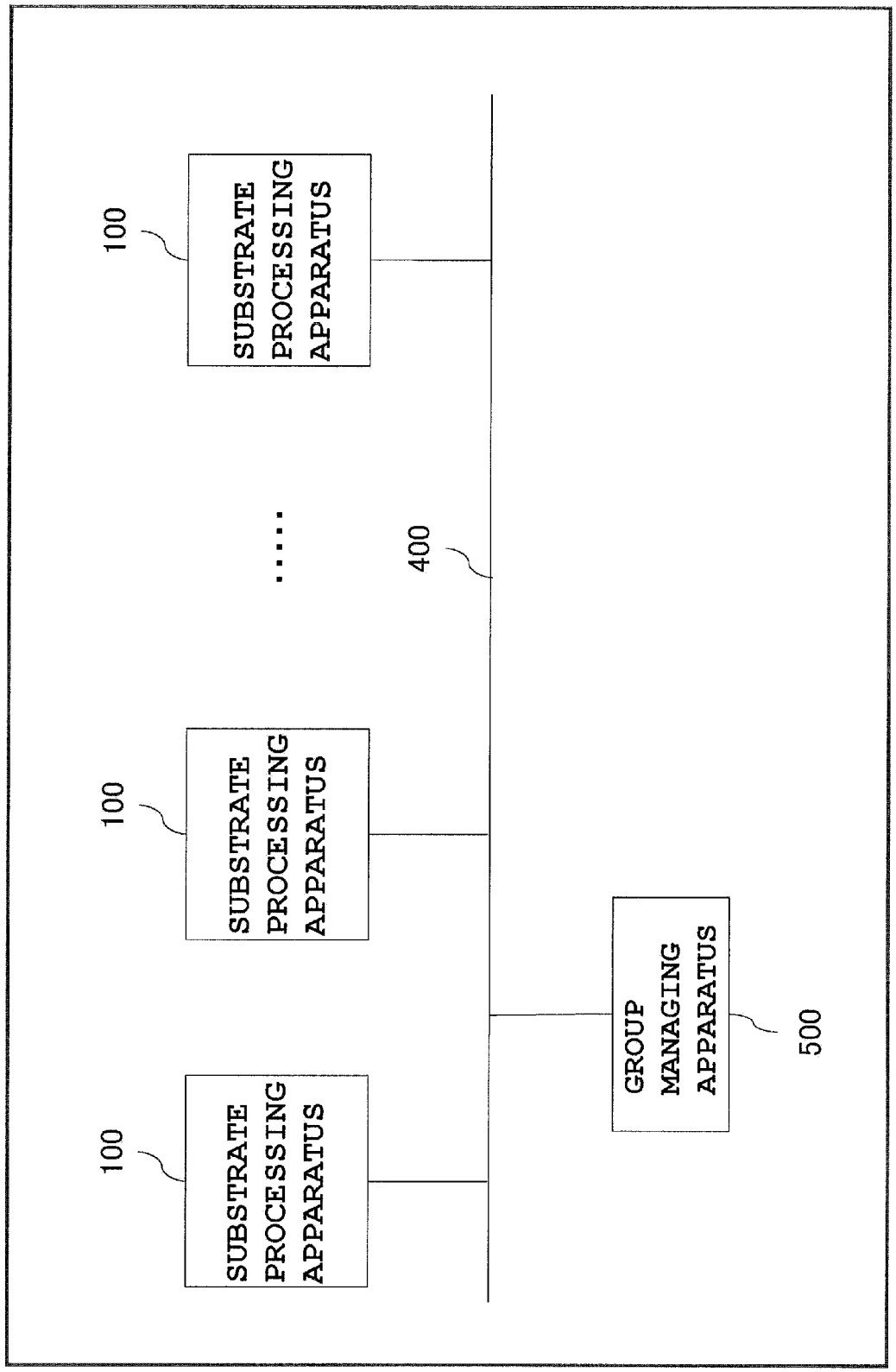
FIG. 1 is a schematic block diagram of a substrate processing system according to an embodiment of the present invention.

First, a structure of a substrate processing system according to an embodiment of the present invention will be described using FIG. 1. FIG. 1 is a schematic block diagram of the substrate processing system according to an embodiment of the present invention.

As shown in FIG. 1, the substrate processing system according to this embodiment, includes at least one set of substrate processing apparatus 100 that executes a substrate processing process based on a recipe defining a processing procedure and a processing condition; and a group managing apparatus 500 connected to the substrate processing apparatus 100 so that data can be exchanged. The substrate processing apparatus 100 and the group managing apparatus 500 are connected to each other by a network 400 such as a premise line (LAN) and a wide-area line (WAN).

(2) Structure of the Substrate Processing Apparatus

Figure 8:
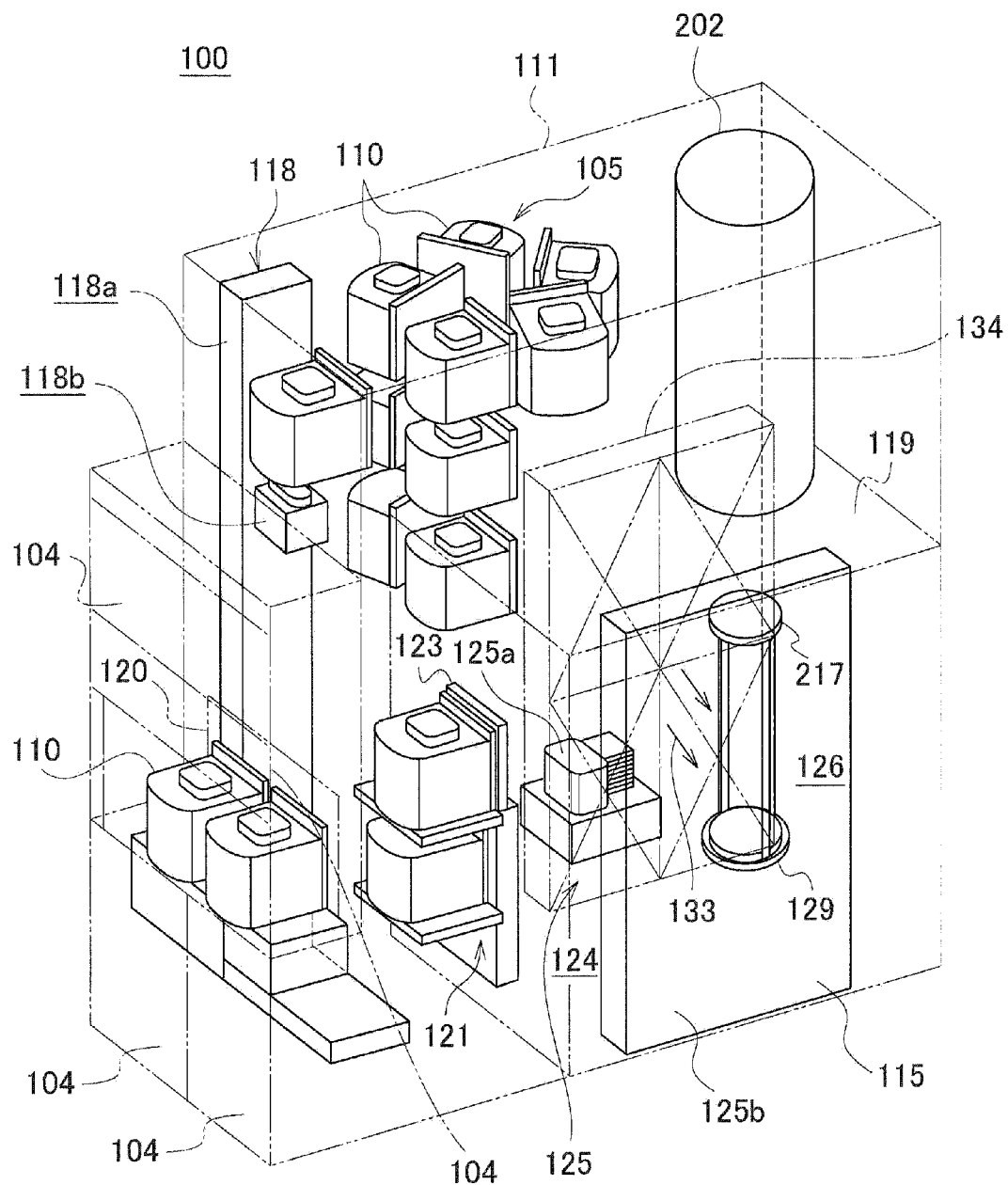
FIG. 8 is a perspective view of the substrate processing apparatus according to an embodiment of the present invention.
Figure 9:
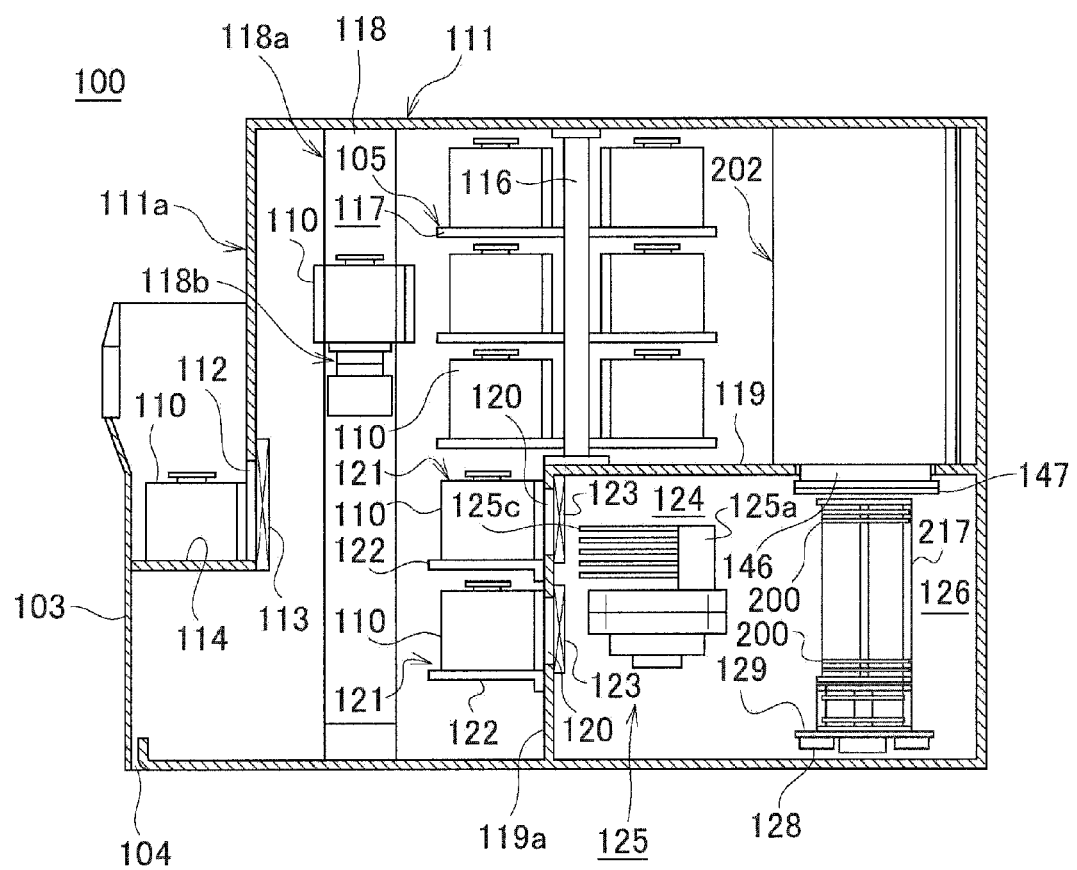
FIG. 9 is a side perspective view of the substrate processing apparatus according to an embodiment of the present invention.

Subsequently, the structure of the substrate processing apparatus 100 according to this embodiment will be described, with reference to FIG. 8 and FIG. 9. FIG. 8 is a perspective view of the substrate processing apparatus according to an embodiment of the present invention. FIG. 9 is a side perspective view of the substrate processing apparatus 100 according to an embodiment of the present invention. Note that the substrate processing apparatus 100 according to this embodiment is constituted as a vertical apparatus that applies treatments of oxidation, diffusion, and CVD to a substrate such as a wafer.

As shown in FIG. 8 and FIG. 9, the substrate processing apparatus 100 according to this embodiment includes a casing 111 formed as a pressure resistant vessel. A front maintenance port 103 is opened as an opening part provided in front of a front wall 111a of the casing 111 to enable a maintenance work. A pair of front maintenance doors 104 are provided on the front maintenance port 103 to open/close the front maintenance port 103. Pods (substrate containers) 110 storing wafers (substrates) 200 such as silicon, are used as carriers for carrying the wafers 200 into/from the casing 111.

A pod loading/unloading port (substrate container loading/unloading port) 112 is opened on the front wall 111a of the casing 111 so as to pass through the casing 111. The pod loading/unloading port 112 is opened/closed by a front shutter (open/close mechanism of the substrate container loading/unloading port). A load port (substrate container transfer table) 114 is installed in front of the pod loading/unloading port 112. Each pod is mounted and aligned on the load port 114. The pod 110 is carried on the load port 114 by an in-step carrier (not shown).

A rotary pod shelf (substrate container placement shelf) 105 is set in an upper part of the casing 111 at approximately a center part in a front-back direction. A plurality of pods 110 are stored on the rotary pod shelf 105. The rotary pod shelf 105 has a support pole 116 which is vertically erected and is intermittently rotated in a horizontal plane, and a plurality of shelf plates (substrate container mounting tables) 117 which are radially supported at each position of upper/middle/lower stages of the support pole 116. The pods 110 are held by a plurality of shelf plates 117 respectively in a state of being mounted thereon.

A pod carrier (substrate container carrier) 118 is installed between the load port 114 and the rotary pod shelf 105 in the casing 111. The pod carrier 118 is constituted of a pod elevator (substrate container elevation mechanism) 118a capable of elevating the pod 110 while holding the pod 110, and a pod carrying mechanism (substrate container carrying mechanism) 118b being a carrier. The pod carrier 118 is configured to carry the pod 110 among the load port 114, the rotary pod shelf 105, and a pod opener (substrate container lid member open/close mechanism) 121, by a sequential operation of the pod elevator 118a and the pod carrying mechanism 118b.

A sub-casing 119 is provided in a lower part of the casing 111, extending from approximately the center part of the casing 111 to a rear end thereof. A pair of wafer loading/unloading ports (substrate loading/unloading port) 120 for carrying the wafer 200 into/from the sub-casing 119, are provided side by side on upper and lower stages vertically. Pod openers 121 are installed on the upper and lower wafer loading/unloading ports 120 respectively.

Each pod opener 121 includes a pair of mounting tables 122 for mounting the pod 110 thereon, and a cap attaching/detaching mechanism (lid member attaching/detaching mechanism) 123 for attaching and detaching a cap (lid member) of the pod 110. The pod opener 121 is configured to open/close a wafer charging/discharging port of the pod 110, by attaching/detaching the cap of the pod 110 mounted on the mounting table 122 by the cap attaching/detaching mechanism 123.

Figure 10:
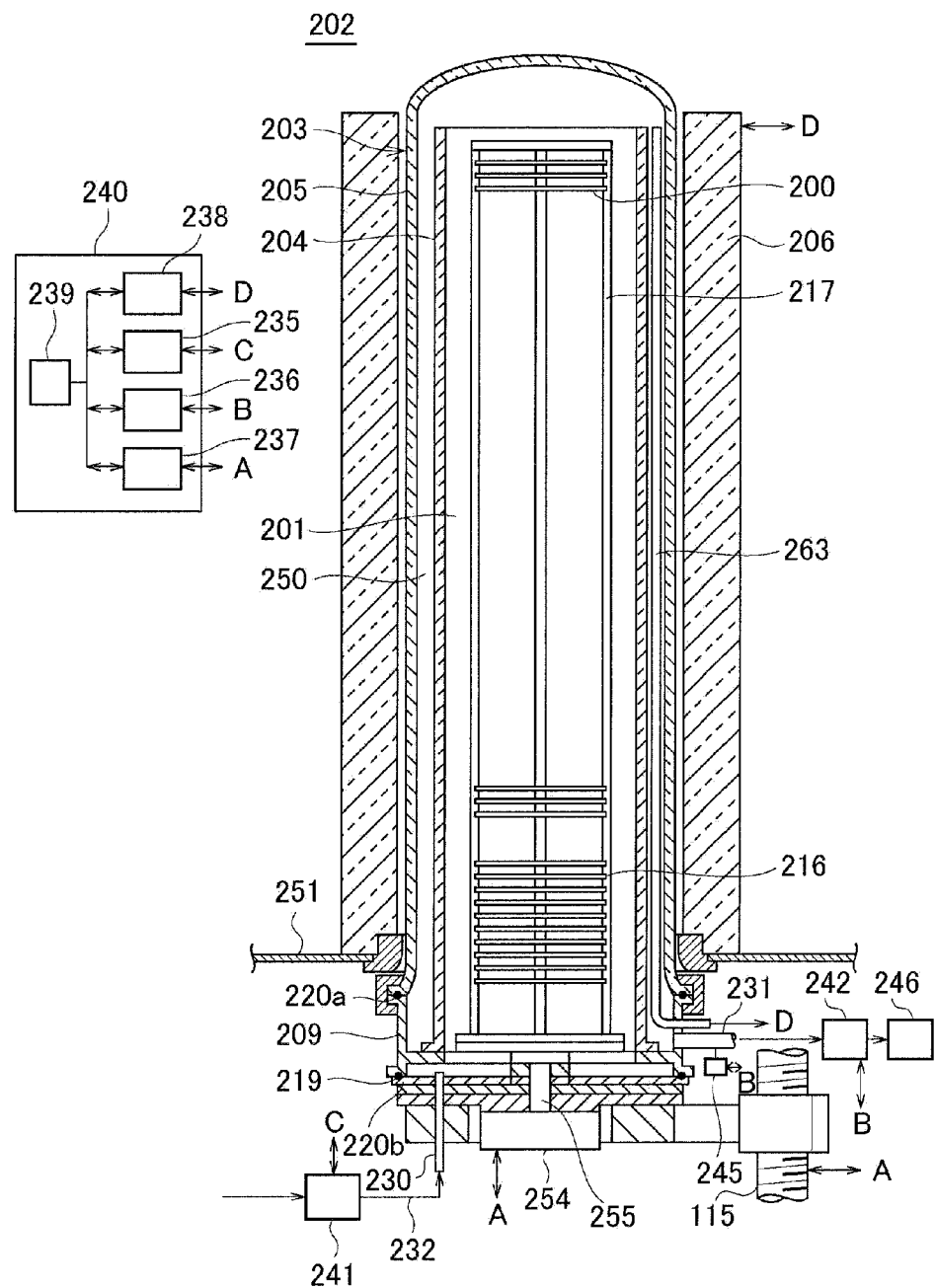
FIG. 10 is a vertical partial view of a processing furnace of the substrate processing apparatus according to an embodiment of the present invention.

A transfer chamber 124 is formed in the sub-casing 119 so as to be fluidly isolated from a space in which the pod carrier 118 and the rotary pod shelf 105, etc., are installed. A wafer transfer mechanism (substrate transfer mechanism) 125 is installed in a front side area of the transfer chamber 124. The wafer transfer mechanism 125 is constituted of a wafer transfer device (substrate transfer device) 125a capable of horizontally rotating or linearly moving the wafer 200, and a wafer transfer device elevator (substrate transfer device elevation mechanism) 125b for elevating the wafer transfer device 125a. As shown in FIG. 10, the wafer transfer device elevator 125b is installed between a right end portion in a front area of the transfer chamber 124 of the sub-casing 119, and a right side end portion of the casing 111. The wafer transfer device 125a includes a tweezer (substrate holder) 125c being a mounting part of the wafer 200. The wafer 200 can be charged and discharged into/from a boat (substrate holding tool) 217, by a sequential operation of the wafer transfer device elevator 125b and the wafer transfer device 125a.

A waiting part 126 is formed in a rear side area of the transfer chamber 124 for housing the boat 217 in which the boat 217 is waited. A processing furnace 202 is formed in an upper part of the waiting part 126 as a substrate processing system. A lower end portion of the processing furnace 202 is configured to be opened/closed by a furnace throat shutter (furnace throat open/close mechanism) 147.

As shown in FIG. 10, a boat elevator (substrate holding tool elevation mechanism) 115 for elevating the boat 217, is installed between a right end portion of the waiting part 126 of the sub-casing 119 and a right side end portion of the casing 111. An arm 128 being a connection tool, is connected to an elevation table of the boat elevator 115. A seal cap 219 being a lid member is horizontally installed on the arm 128. The seal cap 219 is configured to vertically support the boat 217 and close the lower end portion of the processing furnace 202.

The boat 217 includes a plurality of holding members. The boat 217 is configured to horizontally hold a plurality of wafers 200 (for example, about 50 to 125 wafers) in a state of being arranged in a vertical direction with their centers aligned.

As shown in FIG. 10, a clean unit 134 constituted of a supply fan and a dust-free filter is installed on a left side end portion which is an opposite side to the side of a wafer transfer device elevator 125b and the side of a boat elevator 115 of the transfer chamber 124, so as to supply clean atmosphere or clean air 133 which is inert gas. Although not shown, a notch aligner which is a substrate aligner for aligning positions in a circumferential direction of the wafer, is installed between the wafer transfer device 125a and the clean unit 134.

The clean air 133 blown-out from the clean unit 134 is circulated through the notch aligner not shown, the wafer transfer device 125a, and the boat 217 in the waiting part 126, and thereafter is sucked by a duct not shown, and is exhausted to outside of the casing 111 or is circulated to a primary side (supply side) which is a sucked side of the clean unit 134, and is blown-out again into the transfer chamber 124 by the clean unit 134.

(3) Operation of the Substrate Processing Apparatus

Next, an operation of the substrate processing apparatus 100 according to this embodiment will be described with reference to FIG. 8 and FIG. 9.

As shown in FIG. 8 and FIG. 9, when the pod 110 is supplied to the load port 114, the pod loading/unloading port 112 is opened by the front shutter 113. Then, the pod 110 on the load port 114 is loaded into the casing 111 from the pod loading/unloading port 112 by the pod transfer device 118.

The pod 110 loaded into the casing 111 is automatically carried on the shelf plate 117 of the rotary pod shelf 105 by the pod carrier 118 and is temporarily stored thereon, and thereafter is transferred on the mounting table 122 of one of the pod openers 121 from the shelf plate 117. Note that the pod 110 loaded into the casing 111 may be directly transferred on the mounting table 122 of the pod opener 121 by the pod carrier 118. At this time, the wafer charging/discharging port 120 of the pod opener 121 is closed by the cap attaching/detaching mechanism 123, and the clean air 133 is flowed into the transfer chamber 124 so that the transfer chamber 124 is filled with the clean air 133. For example, by filling the inside of the transfer chamber 124 with nitrogen gas as the clean air 133, an oxygen concentration inside of the transfer chamber 124 is 20 ppm or less for example, which is set to be further lower than the oxygen concentration inside of the casing 111.

The opening side end face of the pod 110 mounted on the mounting table 122, is pressed against the opening edge portion of the wafer charging/discharging port 120 on the front wall 119a of the sub-casing 119, and its cap is detached by the cap attaching/detaching mechanism 123, and the wafer charging/discharging port is opened. Thereafter, the wafer 200 is picked-up from the pod 110 through the wafer charging/discharging port by the tweezer 125c of the wafer transfer device 125a, with an orientation aligned by the notch aligner, and thereafter is loaded into the waiting part 126 behind the transfer chamber 124, and is charged into the boat 217. The wafer transfer device 125a with the wafer 200 mounted on the boat 217, is returned to the pod 110, so that next wafer 200 is charged into the boat 217.

During a mounting work of the wafer into the boat 217 by the wafer transfer mechanism 125 in one of the pod openers 121 (upper stage or loser stage), another pod 110 is carried by the pod transfer device 118 from the rotary pod shelf 105 and is transferred on the mounting table 122 of the other pod opener 121 (lower stage or upper stage), so that an opening work of the pod 110 is simultaneously performed by the pod openers 121.

When the previously specified number of wafers 200 are charged into the boat 217, the lower end portion of the processing furnace 202 closed by the furnace throat shutter 147, is opened by the furnace throat shutter 147. Subsequently, the boat 217 holding a group of the wafer 200 is loaded into the processing furnace 202 by being elevated by the boat elevator 115.

After loading, an arbitrary processing is applied to the wafer 200 in the processing furnace 202. After processing, the boat 217 with the wafer 200 after processing stored therein, is unloaded from the processing chamber 201 by approximately a reversed procedure to the aforementioned procedure excluding the aligning step of the wafers by the notch aligner device 135, and the pod 110 with the wafers 200 after processing stored therein, is unloaded from the casing 111.

(4) Structure of the Processing Furnace

Subsequently, the structure of the processing furnace 202 according to this embodiment will be described using FIG. 10. FIG. 10 is a vertical sectional view of the processing furnace 202 of the substrate processing apparatus 100 according to an embodiment of the present invention.

As shown in FIG. 10, the processing furnace 202 includes a process tube 203 which is a reaction tube. The process tube 203 includes an inner tube 204 as an internal reaction tube, and an outer tube 205 as an external reaction tube provided outside. The inner tube 204 is made of a heat-resistant material such as quartz ($SiO_2$) or silicon carbide (SiC), and is formed into a cylindrical shape with its upper end and lower end opened. The processing chamber 201 for processing the wafer 200 being the substrate, is formed in a cylindrical hollow part of the inner tube 204. The processing chamber 201 for processing the wafer 200 being the substrate, is formed in the cylindrical hollow part in the inner tube 204. Inside of the processing chamber 201 is formed so that the boat 217 as will be described later can be housed therein. The outer tube 205 is provided concentrically with the inner tube 204. The outer tube 205 is formed, with its inner diameter larger than an outer diameter of the inner tube 204, and is formed into the cylindrical shape with its upper end closed and lower end opened. The outer tube 205 is made of the heat resistant material such as quartz or silicon carbide.

A heater 206, which is a heating mechanism, is provided outside of the process tube 203, so as to surround the side wall surface of the process tube 203. The heater 206 is formed into the cylindrical shape, and is vertically installed by being supported by a heater base 251 as a holding plate.

A manifold 209 is disposed in a lower part of the outer tube 205 concentrically with the outer tube 205. The manifold 209 is made of stainless, etc., for example, and is formed into the cylindrical shape with its upper end and lower end opened. The manifold 209 is engaged with the lower end portion of the inner tube 204 and the lower end portion of the outer tube 205 respectively, to thereby support them. Note that an O-ring 220a as a sealing member is provided between the manifold 209 and the outer tube 205. The process tube 203 is set in a vertically installed state by being supported by the heater base 251. A reaction vessel is formed by the process tube 203 and the manifold 209.

A nozzle 230 is connected to the seal cap 219 as will be described later as a gas introduction part, so as to communicate with inside of the processing chamber 201. A gas supply pipe 232 is connected to the nozzle 230. A processing gas supply source and an inert gas supply source, etc., not shown are connected to an upstream side of the gas supply pipe 232 (opposite side to a connection side connected to the nozzle 230), through MFC (mass flow controller) 241 as a gas flow controller). A gas flow controller 235 is electrically connected to the MFC 241. The gas flow controller 235 is configured to control the MFC 241 so that flow rate of the gas supplied into the processing chamber 201 is a desired flow rate at a desired timing.

An exhaust pipe 231 for exhausting atmosphere in the processing chamber 201, is provided in the manifold 209. The exhaust pipe 231 is disposed on the lower end portion of a cylindrical space 250 formed by a gap between the inner tube 204 and the outer tube 205, to communicate with the cylindrical space 250. A pressure sensor 245 as a pressure detector such as a pressure adjuster 242 formed as APC (Auto Pressure Controller), and a vacuum exhaust device such as a vacuum pump are sequentially connected from the upstream side to a downstream side of the exhaust pipe 231 (opposite side to the connection side to the manifold 209). Based on a pressure value detected by the pressure sensor 245, a pressure controller 236 is configured to control the pressure adjuster 242 so that the pressure in the processing chamber 201 is a desired pressure at a desired timing.

A seal cap 219, which is a furnace throat lid member, capable of air-tightly closing the lower end opening of the manifold 209, is provided in the lower part of the manifold 209. The seal cap 219 is abutted on the lower end of the manifold 209 from a vertically lower side. The seal cap 219 is made of metal such as stainless, and is formed into a disc shape. An O-ring 220b as a seal member abutted on the lower end of the manifold 209, is provided on an upper surface of the seal cap 219. A rotating mechanism 254 for rotating the boat, is installed on the opposite side to the processing chamber 201 near a center part of the seal cap 219. A rotary shaft 255 of the rotating mechanism 254 is passed through the seal cap 219 to support the boat 217 from below. The rotating mechanism 254 is configured to rotate the wafer 200 by rotating the boat 217. The seal cap 219 is configured to be vertically elevated by the boat elevator 115 as an elevating mechanism which is vertically installed outside of the process tube 203. The boat 217 can be carried into/from the processing chamber 201 by elevating the seal cap 219. A carrying controller 238 is electrically connected to the rotating mechanism 254 and the boat elevator 115. The carrying controller 238 is configured to control the rotating mechanism 254 and the boat elevator 115 so that they are operated as desired at a desired timing.

As described above, the boat 217, which is a substrate holding tool, is configured to hold a plurality of wafers 200 arranged in a horizontal posture, with centers aligned with each other, in multiple stages. The boat 217 is made of a heat resistant material such as quartz and silicon carbide. A plurality of heat insulation plates 216, which are heat insulation members, having a disc shape made of a heat resistant material such as quartz and silicon carbide, are disposed in the lower part of the boat 217 in a horizontal posture in multiple stages, so that heat from the heater 206 is hardly transmitted to the manihold 209 side.

A temperature sensor 263, which is a temperature detector, is installed in the process tube 203. The temperature controller 237 is connected to the heater 206 and the temperature sensor 263. The temperature controller 237 is configured to adjust a power supply state to the heater 206, so that the temperature in the processing chamber 201 shows a desired temperature distribution at a desired timing, based on temperature information detected by the temperature sensor 263.

The gas flow controller 235, the pressure controller 236, the carrying controller 238, and the temperature controller 237 are electrically connected to a display device controller 239 for controlling the whole body of the substrate processing apparatus (the gas flow controller 235, the pressure controller 236, the carrying controller 238, and the temperature controller 237 are also called I/O controllers). These gas flow controller 235, pressure controller 236, carrying controller 238, temperature controller 237, and display device controller 239 are formed as controllers 240 for a substrate processing apparatus. The structure and the operation of the controllers 240 for a substrate processing apparatus will be described later.

(5) Operation of the Processing Furnace

Subsequently, a method for forming a thin film on the wafer 200 by a CVD method using the processing furnace 202 having the aforementioned structure, will be described with reference to FIG. 10, as one step of a manufacturing step of a semiconductor device. Note that in the explanation given hereafter, the operation of each part constituting the substrate processing apparatus 100 is controlled by the controllers 240 for a substrate processing apparatus.

When a plurality of wafers 200 are charged into the boat 217 (wafer charge), as shown in FIG. 10, the boat 217 in which a plurality of wafers 200 are held, is elevated by the boat elevator 115 and is loaded into the processing chamber 201 (boat loading). In this state, the seal cap 219 is set in a state of sealing the lower end of the manifold 209 through the O-ring 220b.

The inside of the processing chamber 201 is vacuum-exhausted by a vacuum exhaust device 246, so as to be a desired pressure (degree of vacuum). At this time, based on a pressure value measured by the pressure sensor 245, (an opening degree of a valve of) the pressure adjuster 242 is feedback-controlled. Further, the inside of the processing chamber 201 is heated by the heater 206 so as to be a desired temperature. At this time, based on a temperature value detected by the temperature sensor 263, a power-supply amount to the heater 2-6 is feedback-controlled. Subsequently, the boat 217 and the wafer 200 are rotated by the rotating mechanism 254.

Subsequently, the gas supplied from the process gas supply source and controlled to be a desired flow rate by MFC 241, is flowed into the gas supply pipe 232 and is introduced into the processing chamber 201 from the nozzle 230. The introduced gas rises through the processing chamber 201, and is flowed-out into a cylindrical space 250 from an upper end opening of the inner tube 204, and is exhausted from the exhaust pipe 231. The gas is brought into contact with a surface of the wafer 200 when passing through the processing chamber 201, and a thin film is deposited on the surface of the wafer 200 at this time by thermal CVD reaction.

When a previously set processing time is elapsed, the inert gas is supplied from the inert gas supply source, so that the inside of the processing chamber 201 is replaced with the inert gas, and the pressure in the processing chamber 201 is returned to a normal pressure.

Thereafter, the seal cap 219 is lowered by the boat elevator 115, to open the lower end of the manifold 209, and the boat 217 holding the processed wafer 200 is unloaded to the outside of the process tube 203 from the lower end of the manifold 209 (boat unloading). Thereafter, the processed wafer 200 is taken out from the boat 217, and is stored in the pod 110 (wafer discharge).

(6) Structure of the Controller for a Substrate Processing Apparatus

Figure 2:
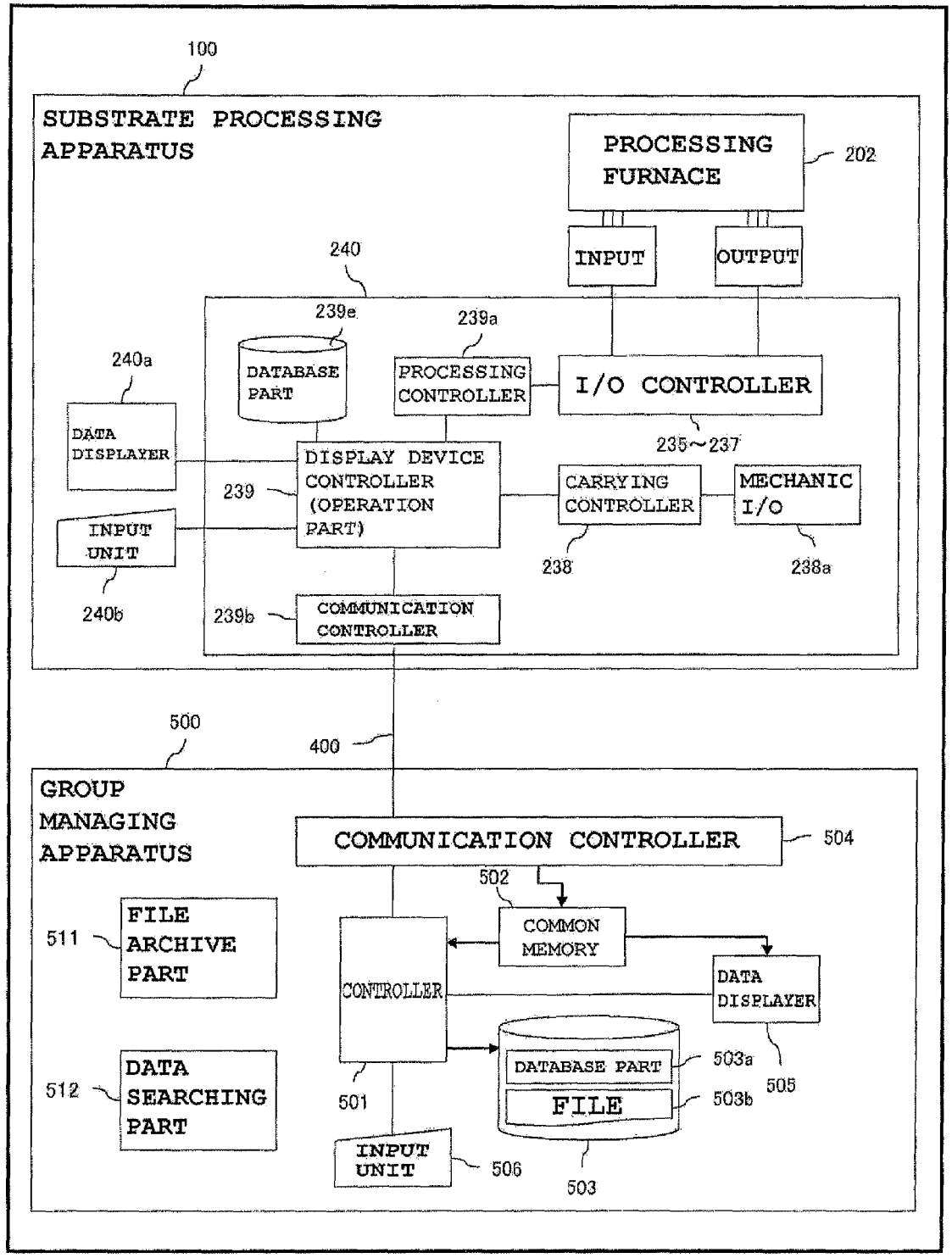
FIG. 2 is a block diagram of a substrate processing apparatus and a group managing apparatus according to an embodiment of the present invention.

Subsequently, the structure of the controller 240 for a substrate processing apparatus according to this embodiment, will be described using FIG. 2. FIG. 2 is a block diagram of the substrate processing apparatus 100 and a group managing apparatus 500 according to an embodiment of the present invention.

The controllers 240 for a substrate processing apparatus, include a processing controller 239a connected to the aforementioned I/O controllers (gas flow controller 235, pressure controller 236, temperature controller 237) for controlling the processing furnace 202 so that data can be exchanged with the I/O controllers. The processing controller 239a is configured to control the operation of the processing furnace 202 through the I/O controller, and collect (read) monitor data showing a state of the processing furnace 202 (temperature, gas flow rate, and pressure, etc.).

The controllers 240 for a substrate processing apparatus include a display device controller (operation part) 239 connected to the processing controller 239a so that data can be exchanged. A data displayer 240a such as a display and an input unit 240b such as a keyboard are respectively connected to the display device controller 239. The display device controller 239 is configured to receive input (such as input of an operation command) from the input unit 240b by an operator, and display screens on a data displayer 240a, which are screens such as a screen for displaying the state of the substrate processing apparatus 100 and a screen for receiving the input of operation.

Further, the controllers 240 for a substrate processing apparatus include the carrying controller 238 connected to the display device controller 239 so that data can be exchanged, and a mechanic I/O 238a connected to the carrying controller 238 so that data can be exchanged. Each part constituting the substrate processing apparatus 100 (for example, the pod elevator 118a, pod carrying mechanism 118b, pod opener 121, wafer transfer mechanism 125, and boat elevator 115, etc.) is connected to the mechanic I/O 238a. The carrying controller 238 is configured to control the operation of each part constituting the substrate processing apparatus 100 through the mechanic I/O 238a, and collect (read) the monitor data showing a state of each part (for example a position, an open/close state, and whether the state is an operating state or a waiting state) that constitutes the substrate processing apparatus 100.

Further, the controllers 240 for a substrate processing apparatus include a data holding part 239e connected to the display device controller 239. The data holding part 239e is configured to hold (store) programs for realizing various functions of the controllers 240 for a substrate processing apparatus, setting data (recipe data) of the substrate processing step executed by the processing furnace 202, and each kind of data read from the I/O controller (gas flow controller 235, pressure controller 236, and temperature controller 237) and the carrying controller 238.

Further, the controllers 240 for a substrate processing apparatus include a communication controller 239b connected to the display device controller 239. Further, although not shown, the aforementioned I/O controllers (gas flow controller 235, pressure controller 236, and temperature controller 237) and the carrying controller 238, are connected to the communication controller 239b so that data can be directly exchanged not through the processing controller 239a and the display device controller 239. Note that the communication controller 239b is connected to the substrate processing apparatus as will be described later, so that data can be exchanged through a network 400.

The communication controller 239b is configured to receive the monitor data through the processing controller 239a and the display device controller 239, which is the monitor data showing the state of the processing furnace 202

(temperature, gas flow rate, and pressure etc.) read through the I/O controllers (gas flow controller 235, pressure controller 236, and temperature controller 237), and transmit it to the group managing apparatus 500. Further, the communication controller 239b is configured to receive the monitor data through the carrying controller 238 and the display device controller 239, which is the monitor data showing the state of each part (position, open/close state, whether the state is the operating state or the waiting state, etc.) that constitutes the substrate processing apparatus 100 read through the mechanic I/O 238a, and transmit it to the group managing apparatus 500.

Further, the communication controller 239b is configured to directly receive the monitor data not through the processing controller 239a and the display device controller 239, which is the monitor data showing the state of the processing furnace 202 (such as temperature, gas flow rate, and pressure, etc.) read through the I/O controller, and transmit it to the group managing apparatus 500. Further, the communication controller 239b is also configured to directly receive the monitor data not through the display device controller 239, which is the monitor data showing the state of each part (such as position, open/close state, whether the state is the operating state or the waiting state, etc.) that constitutes the substrate processing apparatus 100 read through the mechanic I/O 238a, and transmit it to the group managing apparatus 500.

Although not shown, the aforementioned I/O controllers (gas flow controller 235, pressure controller 236, and temperature controller 237) and the carrying controller 238 are also configured so that data can be directly exchanged with the group managing apparatus 500 not through the processing controller 239a, the display device controller 239, and the communication controller 239b. Then, the I/O controller is configured to directly transmit the monitor data to the group managing apparatus 500 not through the processing controller 239a, the display device controller 239, and the communication controller 239b, which is the monitor data showing the state of the processing furnace 202 (such as temperature, gas flow rate, and pressure, etc.) read through the I/O controllers. Further, the mechanic I/O 238a is configured to directly transmit the monitor data to the group managing apparatus 500 not through the display device controller 239 and the communication controller 239b, which is the monitor data showing the state of each part (such as position, open/close state, whether the state is the operating state or the waiting state, etc.) that constitutes the substrate processing apparatus 100 read through the I/O controller.

(7) Structure of the Group Managing Apparatus

Subsequently, the structure of the group managing apparatus 500 according to this embodiment will be described with reference to mainly FIG. 2 to FIG. 7, which is the group managing apparatus 500 configured so that data can be exchanged with the aforementioned substrate processing apparatus 100.

Figure 3:
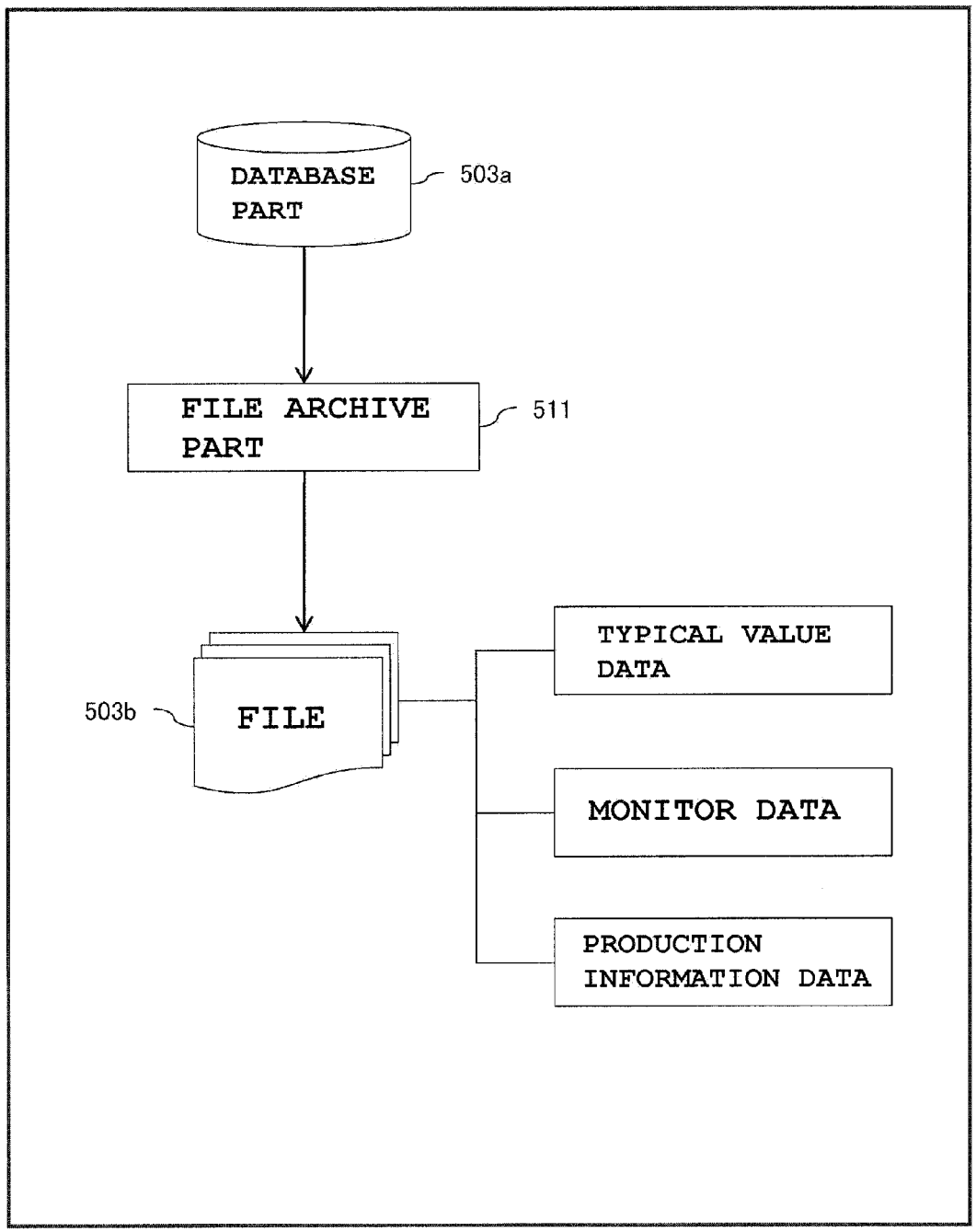
FIG. 3 is a schematic view showing an internal operation of the group managing apparatus according to an embodiment of the present invention.
Figure 4:
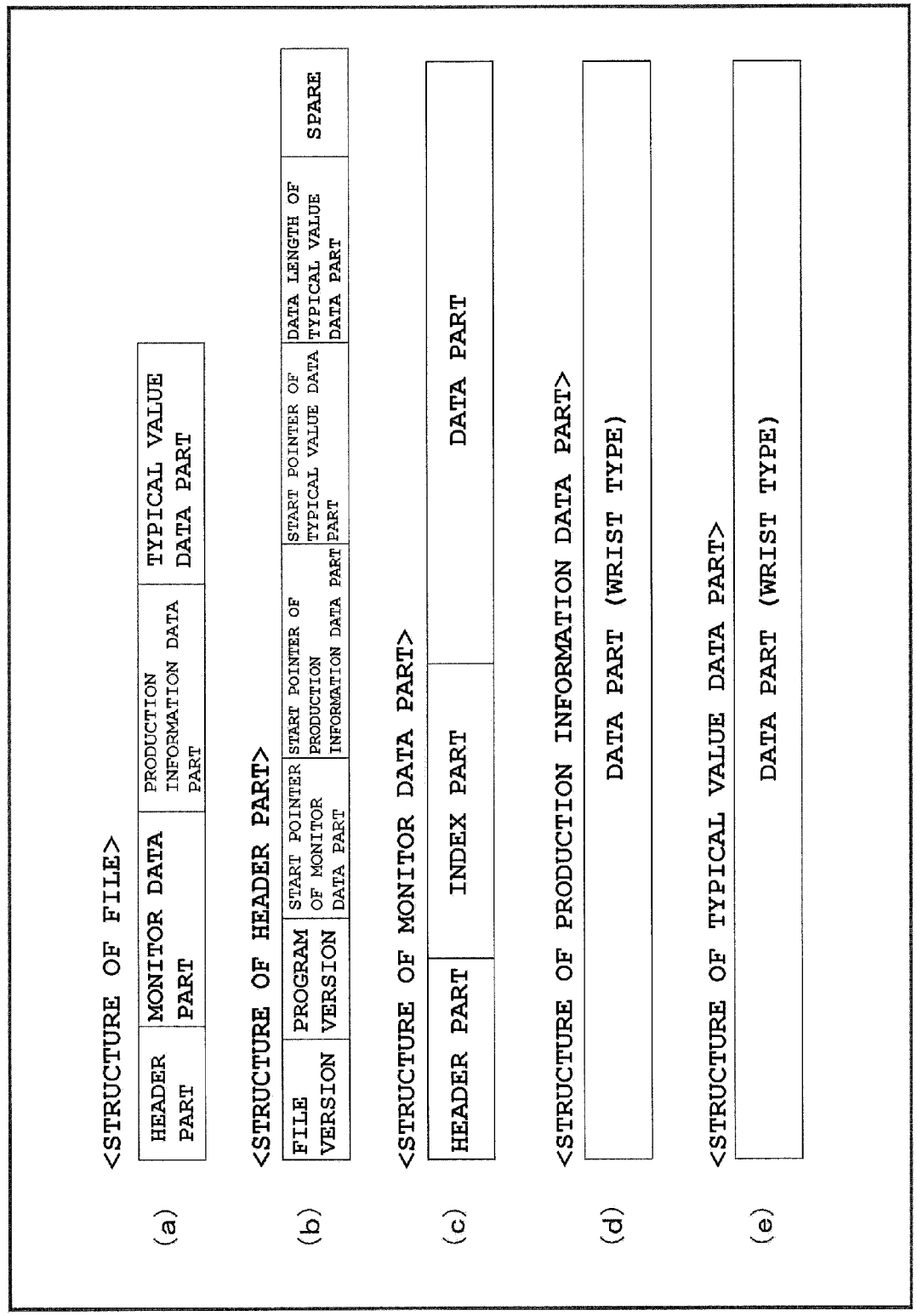
FIG. 4 is a schematic view showing a structure of a file according to an embodiment of the present invention.
Figure 6:
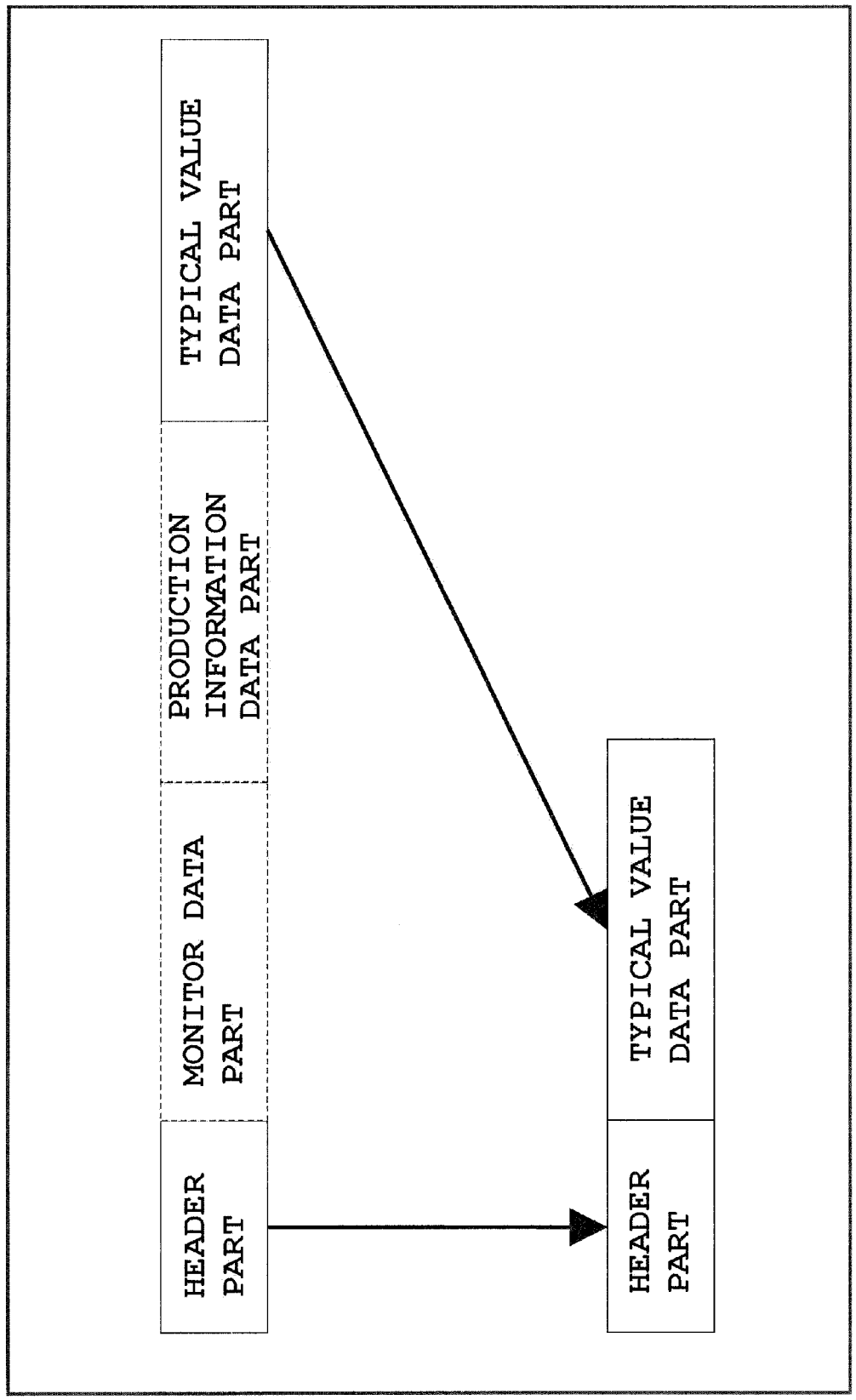
FIG. 6 is a schematic view showing a state of a file operation by a file archive part according to an embodiment of the present invention.
Figure 7:
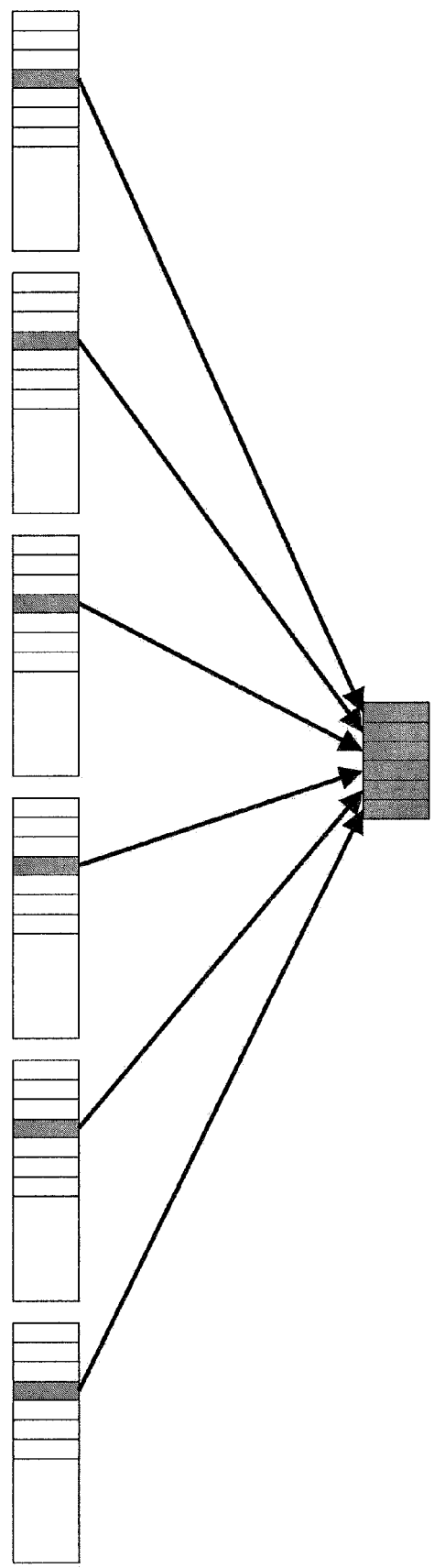
FIG. 7 is a schematic view showing a state of file search by a data searching part according to an embodiment of the present invention.

FIG. 2 is a block diagram of the substrate processing apparatus 100 and the group managing apparatus 500 according to this embodiment. FIG. 3 is a schematic view showing an internal operation of the group managing apparatus 500 according to this embodiment. FIG. 4 is a schematic view showing the structure of a file according to this embodiment. FIG. 5 is a schematic view showing the structure of a typical value data part according to this embodiment. FIG. 6 is an outline view showing a state of a file operation by a file archive part 511 according to this embodiment. FIG. 7 is an outline view showing a state of file search by a data searching part 512 according to this embodiment.

As shown in FIG. 2, the group managing apparatus 500 is comprised as a computer including a controller 501 formed as a central processing unit (CPU); a memory (not shown) including a common memory area 502 inside; a storage part 503 formed as a storage device such as HDD; a data displayer 505 such as a display device as a display unit; an input unit 506 such as a keyboard; and a communication controller 504 as a communication unit. The aforementioned memory, storage part 503, data displayer 505, input unit 506, and communication controller 504 are formed so that data can be exchanged with the controller 501 through an internal bus, etc. Further, the controller 501 has a clock function not shown.

(Communication Controller)

The communication controller 504, which is a communication unit, is connected to the communication controller 239b of the controllers 240 for a substrate processing apparatus, and is also connected to the I/O controllers (gas flow controller 235, pressure controller 236, and temperature controller 237) and a carrying controller 238. The communication controller 504 is configured to receive the monitor data from the substrate processing apparatus 100 and transfer it to the common memory 502. Note that the monitor data transferred to the common memory 502 is configured to be added with data ID for specifying the monitor data, data time information showing a creation time of the monitor data, and production information data. In addition, the production information data includes apparatus specifying information (such as apparatus name, serial number, and address information, etc.) for specifying the substrate processing apparatus 100 out of the plural substrate processing apparatuses 100, which is a creation source of the monitor data, recipe specifying information for specifying a recipe executed by the substrate processing apparatus 100 when the monitor data is created, process specifying information for specifying a substrate processing process executed by the substrate processing apparatus when the monitor data is the production information for specifying a film thickness value and a transfer position of the wafer 200, data ID for specifying the production information data (also called display data ID hereafter), and encoding information showing whether or not an object is a target to be encoded (compressed).

(Storage Part)

The storage part 503 stores a database program, a file archive program, and a data searching program (all of them are not shown) respectively. The database program is read from the storage part 503 by a memory (not shown) and is executed by the controller 501 so that a database part 503a is realized by the group managing apparatus 500. Further, the file archive program is read from the storage part 503 into the memory (not shown) and is executed by the controller 501 so that a file archive part 511 as will be describe late is realized by the group managing apparatus 500. Further, the data searching program is read from the storage part 503 into the memory (not shown) and is executed by the controller 501, so that a data searching part 512 as will be described later is realized by the group managing apparatus 500.

(Database Part)

The database part 503a is configured to store the monitor data received by the communication controller 504 and stored in the common memory 502, in association with each of the data ID, data time information, and production information data, so as to be read in the storage part 503.

(File Archive Part)

The file archive part 511 is configured to read from the database part 503a, each of a plurality of monitor data, production information data and data ID, etc., in association with the monitor data. Then, the file archive part 511 is configured to create typical value data based on the read monitor data. The typical value data is the data showing a minimum value, a maximum value, and an average value, etc., for example, out of the read plurality of monitor data. Note that the typical value data is also specified by prescribed data ID. The data ID for specifying the typical value data is also called display data ID hereafter.

Then, the file archive part 511 is configured to encode (compress) any one of the monitor data, production information data, and typical value data based on the data ID. For example, the monitor data is encoded (compressed) or not, for each data ID. Further, the production information data and the typical value data are also encoded or not for each data ID (for each display data ID). Thus, by encoding prescribed data, a size of a file 503b as will be described later can be reduced. Further, by not encoding the prescribed data (by selectively compressing data), labor of decoding data can be eliminated, and a higher speed of data access is achieved.

Then, the file archive part 511 is configured to prepare the file 503b including encoded data (for example, encoded monitor data) and unencoded data (for example, production information data and typical value data). Then, the file archive part 511 is configured to readably store the prepared file 503b in the storage part 503, in association with the data ID and the data time information.

An outline structure of the file 503b prepared by the file archive part 511 is shown in FIG. 4(a). The file 503b according to this embodiment includes a header part, a monitor data part for storing the monitor data (or encoded monitor data), a production information data part for storing production information data (or encoded production information data), and a typical value data part for storing typical value data (or encoded typical value data).

As a detailed structure is shown in FIG. 4(b), a header part of the file 503b includes a "file version" area for storing version information of the file 503b, a "program version" area for storing the version information of a file archive program, a "monitor data part start pointer" area for storing pointer information showing a relative start position of a monitor data part from a head of the file 503b, a "production information data part start pointer" area for storing pointer information showing a relative start position of a production information data part from the head of the file 503b, a "typical value data part start pointer" area for storing pointer information showing a relative start position of a typical value data part from the head of the file 503b, a "typical value data part data length" area for storing information regarding a data length of the typical value data part, and a spare area.

As a detailed structure is shown in FIG. 4(c), the monitor data part of the file 503b includes a "header part" area for storing data points, a format version, etc., as the information specific to monitor data, an "index part" for storing a relative start position (pointer) of a data storage part of each data from the head of the file 503b, a data length of each data, data ID for specifying the monitor data, kind of an encoding (compression) method, and encoding information showing whether or not an object should be encoded (compressed), and a "data part" area for storing the monitor data added with data time information. Further, As a detailed structure is shown in FIG. 4(d), (e), the production information data part and the typical value data part of the file 503b are configured as a wrist type data storage area.

Although not shown, out of the plural substrate processing apparatuses 100 the production information data part of the file 503b stores apparatus specifying information (name of apparatus, serial number, and address information, etc.) for specifying the substrate processing apparatus 100 which is a creation source of the monitor data, recipe specifying information for specifying a recipe executed by the substrate processing apparatus when the monitor data is created, process specifying information for specifying a substrate processing process executed by the substrate processing apparatus when the monitor data is the production information regarding a value of a film thickness and the information for specifying a transfer position of the wafer 200, data ID (display data ID) for specifying production information data, and encoding information showing whether or not the object should be encoded (compressed), etc.

As a detailed structure is shown in FIG. 5, the typical value data part of the file 503b stores typical value name information showing a name of a typical value, typical value extracting condition information showing a calculating condition of a typical value such as an average value, a maximum value, a minimum value, and a standard deviation, typical value extracting section information showing a section (for example, step 10 or step DEPO, etc.) for extracting the typical value, typical value extracting time information showing start date and end date of actually extracting the typical value, typical value information showing the typical value itself, typical value creating date information showing the date and time of creating the typical value, typical value calculating time information showing the time required for calculating the typical value, data point information showing the number of data points used for calculating the typical value, typical value No information which is the number for uniquely identifying the typical value when a plurality of same typical values exist in the same file 503b, data ID (display data ID) for specifying typical value data, and encoding information showing whether or not the object should be encoded (compressed), respectively.

Preparation of the file 503b is performed by the file archive part 511 periodically at intervals of a prescribed period, or is irregularly performed when an alarm is issued from the substrate processing apparatus 100 or in accordance with a progress state of a substrate processing recipe. Then, by storing a plurality of files 503b in the storage part 503, a file archive (an assembly of the files 503b) of the monitor data received from the substrate processing apparatus 100 is constructed in the storage part 503.

In addition, the file archive part 511 is independently configured to eliminate from each file 503b including the header part, the monitor data part, the production information data part, and the typical value data part. Such a state is shown in FIG. 6. In FIG. 6, the monitor data part and the production information data part are eliminated from the file 503b including the header part, the monitor data part, the production information data part, and the typical value data part. By file operation performed by the file archive part 511, for example the file storing only the information that can be disclosed, can be outputted to a third person. Further, a size of the file archive can be suitably reduced.

(Data Searching Part)

In order to search the monitor data from the file archive (the assembly of the files 503b), a prescribed searching condition including at least data ID and data time information, is inputted into the input unit 506. Further, in order to search the production information data or the typical value data from the file archive, a prescribed searching condition including at least data ID (display data ID) is inputted into the input unit 506. The data searching part 512 is configured to receive the input of the aforementioned searching condition, and search the file 503b matching with the searching condition from the file archive, and display data (all data of the monitor data, the production information data, and the typical value data, or any one of these data) stored in the file 503b, on the data displayer 505 as a display unit.

Further, the data searching part 512 is configured to search a plurality of files 503b having the same typical value data, so that a file can be prepared having the same typical value data which is extracted from these files 503b, with the extracted data linked to each other. This state is shown in FIG. 7.

In addition, the data searching part 512 is configured to not only search the file 503b, but also search the database part 503a, when input of the aforementioned searching condition is received. Namely, a maintenance staff can seamlessly access the database part 503a and the file archive capable of accessing the past monitor data uniquely using the data searching part 512, without considering which of the database part 503a and the file archive (file 503b) stores the monitor data to be searched.

(8) Operation of the Group Managing Apparatus

Subsequently, the operation of the group managing apparatus 500 according to this embodiment will be described. This operation is performed as one step of the manufacturing step of the semiconductor device.

(Monitor Data Receiving Step)

First, the communication controller 504 included in the group managing apparatus 500 receives the monitor data showing a progress state of the recipe or a state of the substrate processing apparatus 100, from the substrate processing apparatus 100, and transfers it to the common memory 502. The monitor data transferred to the common memory 502 is added to the data ID for specifying the monitor data, the data time information showing the time when the monitor data is created, and the production information data.

(Monitor Data Storing Step)

The database part 503a of the group managing apparatus 500 associates the monitor data stored in the common memory 502 with the aforementioned data ID, data time information, and production information data respectively, and readably stores it in the storage part 503.

(File Preparing Step)

The file archive part 511 of the group managing apparatus 500 respectively reads a plurality of monitor data and the production information data and the data ID associated with the monitor data from the database part 503a. Then, the file archive part 511 creates the typical value data based on the read monitor data. Note that the file archive part 511 sometimes encodes (compresses) at least any one of the monitor data, the production information data, and the typical value data based on the data ID. Then, the file archive part 511 prepares the file 503b including encoded data (encoded monitor data in the aforementioned example) and unencoded data (the production information data and the typical value data in the aforementioned example). Then, the file archive part 511 associates the prepared file 503b with the data ID and the data time information, and stores it in the storage part 503 so as to be read.

In addition, preparation of the file 503b is performed by the file archive part 511 periodically at intervals of a prescribed period, or is irregularly performed when an alarm is issued from the substrate processing apparatus 100 or in accordance with a progress state of a substrate processing recipe. Then, by storing a plurality of files 503b in the storage part 503, a file archive (an assembly of the files 503b) of the monitor data received from the substrate processing apparatus 100 is constructed in the storage part 503.

(Monitor Data Searching Step)

The data searching part 512 of the group managing apparatus 500 receives the input of a prescribed searching condition including the data ID and the data time information, and a prescribed searching condition including at least the data ID (display data ID), and searches the file 503b matching with the searching condition from the file archive, and displays the data matching with the searching condition stored in the file 503b (all data of monitor data, production information data, and the typical value data, or any one of these data), on the data displayer 505 as a display unit.

(9) Effect by One Embodiment of the Present Invention

According to this embodiment, one or a plurality of effects shown below are exhibited.

(a) A group managing apparatus 500 according to this embodiment includes:

a database part 503a that readably stores the monitor data received by a communication controller 504 in association with the production information data;

a file archive part 511 that reads the monitor data and the production information data from the database part 503a, then creates the typical value data based on the monitor data, and prepares a file 503b including the monitor data, the production information data, and the typical value data, and readably stores the file 503b; and a data searching part 512 that receives the input of the prescribed searching condition to search the file 503b, and displays the data stored in the file 503b and matching with the searching condition, on a data displayer 505.

Thus, the maintenance staff can speedily and accurately select a method of analysis and indication of various data. Further, proper data can be speedily read from enormous data accumulated in the group managing apparatus 500. As a result, analysis of abnormality can be speedily and accurately performed irrespective of the skill of the maintenance staff, thus making it possible to reduce a load of the operator who performs analysis of abnormality. Further, variation of analysis results due to the skill of the operator can be restrained.

Further, there is no necessity for backup of enormous monitor data using an external storage device such as a magnetic tape. Thus, a restoring work of restoring backup data in the group managing apparatus for referring to the past monitor data is not required, thus improving usability of using data. In addition, there is no necessity for dividing the database 503a which is constructed in the group managing apparatus 500 for backup of apart thereof in an external storage device, etc. Thus, similarly, the restoring work is not required for referring to the past monitor data, thus improving the usability of using data.

Further, portability of data can be increased by utilizing the file archive. Then, by utilizing the outer storage device and other computer for storing the file 503b, memory capacity of the storage part 503 provided in the group managing apparatus 500 can be efficiently used by utilizing the external storage device and other computer for storing the file 503b. In addition, analysis of the file 503b can be performed even by offline (even if not being stored in the group managing apparatus 500), and therefore the analysis can be easily performed in a distant site.

Note that according to a conventional group managing apparatus not having the file archive constructed therein as shown in this embodiment, there are problems that (1) there is a physical upper limit even if a large capacity hard disc is mounted thereon for example, because collected monitor data is recorded in a nonvolatile medium such as a database and a file, (2) a collection period of data (grain degree of data) and the number of collection points are different depending on the structure and the specification of the substrate processing apparatus 100, and a using procedure of the nonvolatile medium is also different, and therefore a data storage period can't be secured, (3) it can't be said that data compression efficiency of the database itself is high, and a long-term storage of the collected monitor data is difficult, (4) although the data on the database can be divided as a file by dividing a table and using a data partition function, in this case as well, the data can't be browsed if there is no database engine of an upper-order system, (5) the restoring work from the magnetic tape for utilizing the monitor data is required when the monitor data accumulated on the database is regularly backed-up on the magnetic tape, etc., and (6) the restoring work can't be performed when a database area is tight to occupy the whole capacity of the nonvolatile medium, and newest monitor data is stored on the database, thus making it difficult to restore old monitor data.

(b) The file archive part 511 according to this embodiment is configured to encode (compress) any one of the monitor data, the production information data, and the typical value data based on the data ID. For example, the monitor data is encoded (compressed) if the data ID is a prescribed value, and the production information data and the typical value data are not encoded if the display data ID is a prescribed value. Thus, by encoding the prescribed data, the size of the file 503*b* as will be described later, can be reduced. Further, by not encoding the prescribed data (by selectively compressing the data), labor of decoding data can be eliminated, thus making it possible to achieve a higher speed of accessing data.

(c) The file archive part 511 according to this embodiment is independently configured to be eliminated respectively the header part, the monitor data part, the production information data part, and the typical value data part in each file 503*b*. By performing such a file operation by the file archive part 511, the file storing only the information that can be disclosed for example, can be outputted to a third person. Further, the size of the file archive can be reduced as needed.

(d) The data searching part 512 according to this embodiment is configured to search a plurality of files 503*b* having the same typical value data, so that a file can be prepared having the same typical value data which is extracted from these files 503*b*, with the extracted data linked to each other. Thus, the usability of analysis of the monitor data by the maintenance staff can be improved.

(e) The data searching part 512 according to this embodiment is configured to not only search the file 503*b* but also search the database part 503*a* when the input of the prescribed searching condition is received. Namely, the maintenance staff can uniquely access the past monitor data using the data searching part 512 (can seamlessly access the database part 503*a* and the file archive), without considering which of the database part 503*a* and the file archive (file 503*b*) stores the monitor data to be searched, thus improving the usability during analysis of abnormality.

Other Embodiment of the Present Invention

The substrate processing system according to this embodiment is different from the aforementioned embodiments, in a point that "definition information data" is further managed as the information showing a state of a creation spot (for example, the temperature sensor, the gas flowmeter, and the pressure gauge, and they are called simply sensors) of the monitor data in the substrate processing apparatus 100. Further, the substrate processing system according to this embodiment is different from the aforementioned embodiments in a point that identification information (called "sensor ID") for specifying the creation spot (sensors) of the monitor data is used. Note that as will be described later, the sensor ID is one of the data items included in the definition information data.

(1) Structure of the Group Managing Apparatus

The database part 503*a* of the group managing apparatus 500 according to this embodiment is configured to readably store the monitor data received by the communication unit 504 into the storage part 503, in association with the production information data and the definition information data. Further, the file archive part 511 of the group managing apparatus 500 according to this embodiment is configured to read the monitor data from the database part 503*a* in association with the production information data and the definition information data, then create the typical value data based on the monitor data, and prepare the file 503*b* including the monitor data, the production information data, the definition information data, the typical value data, and readably store the file 503*b* in the storage part 503. Other structure is similar to the structure of the aforementioned embodiment.

Figure 11:
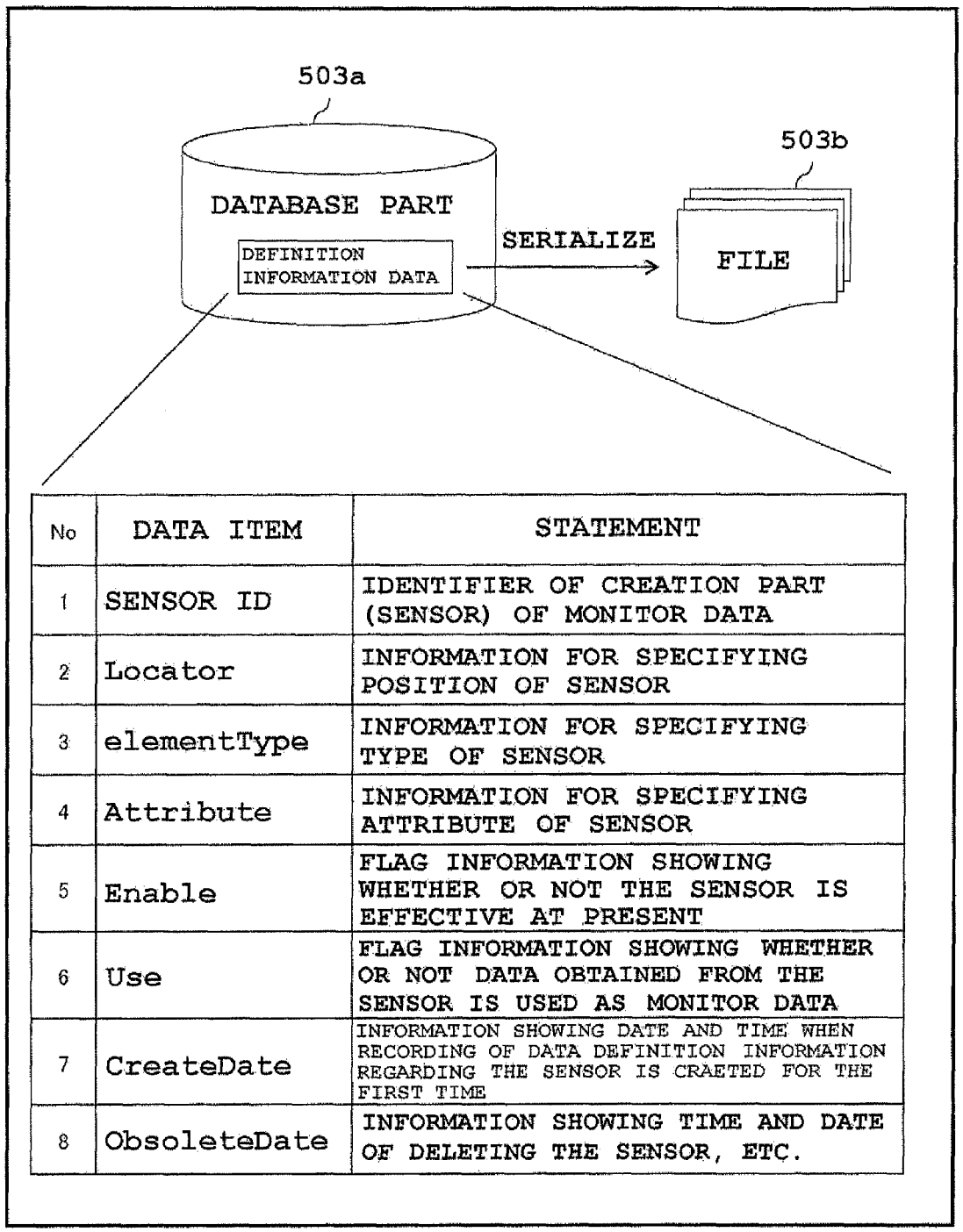
FIG. 11 is a schematic view showing a structure of a definition information data managed by the substrate processing system according to other embodiment of the present invention.

A specific structure of the definition information data is shown in FIG. 11. Note that a data structure of the definition information data can be the data structure that complies with a SEMI standard for example.

The data definition information includes the information for specifying the sensor (Sensor ID), the information for specifying a position of the sensor (Locator), the information for specifying a type of the sensor (ElementType), the information for specifying an attribute of the sensor (Attribute), the information showing whether or not the sensor is effective at present (Enable), the flag information showing whether or not the data obtained from the sensor is used as the monitor data (Use), the information showing date and time when recording of the data definition information regarding the sensor is generated for the first time (CreateDate), and the information showing the date and time when the sensor is deleted. (ObsoleteDate).

As described above, the sensor ID is the information for specifying the creation spot (sensor) of the monitor data, and is utilized as the data ID for specifying the monitor data. As will be described later, the sensor ID is a value obtained by carrying out prescribe arithmetic creation to the Locator, elementType, and Attribute, and is unique in at least the substrate processing apparatus 100, and has the characteristic that it is invariable even if change in structure (addition or elimination of the sensor) of the substrate processing apparatus 100 is generated. The Locator, elementaType, and Attribute are the information held by the controllers 240, etc., for a substrate processing apparatus, namely the substrate processing apparatus 100, for identifying the sensor. The aforementioned pieces of information are hierarchized, and by combining them, the specific structure of the sensor can be identified. In the group managing apparatus 500 as well, the information can be managed for the purpose of calculating the sensor ID, etc. A value of Enable flag is suitably operated by the group managing apparatus that detects life and death of the sensor. Further, a value of Use flag is suitably operated from the input unit 506, etc., in accordance with a policy of acquiring the monitor data. Note that values of the CreateDate and ObsoleteDate are set when the definition information data is newly prepared or updated, and can be utilized in the searching condition for narrowing a searching range of the monitor data.

Note that the aforementioned data definition information is managed for each sensor provided in the substrate processing apparatus 100.

(2) Operation of the Group Managing Apparatus

Figure 12:
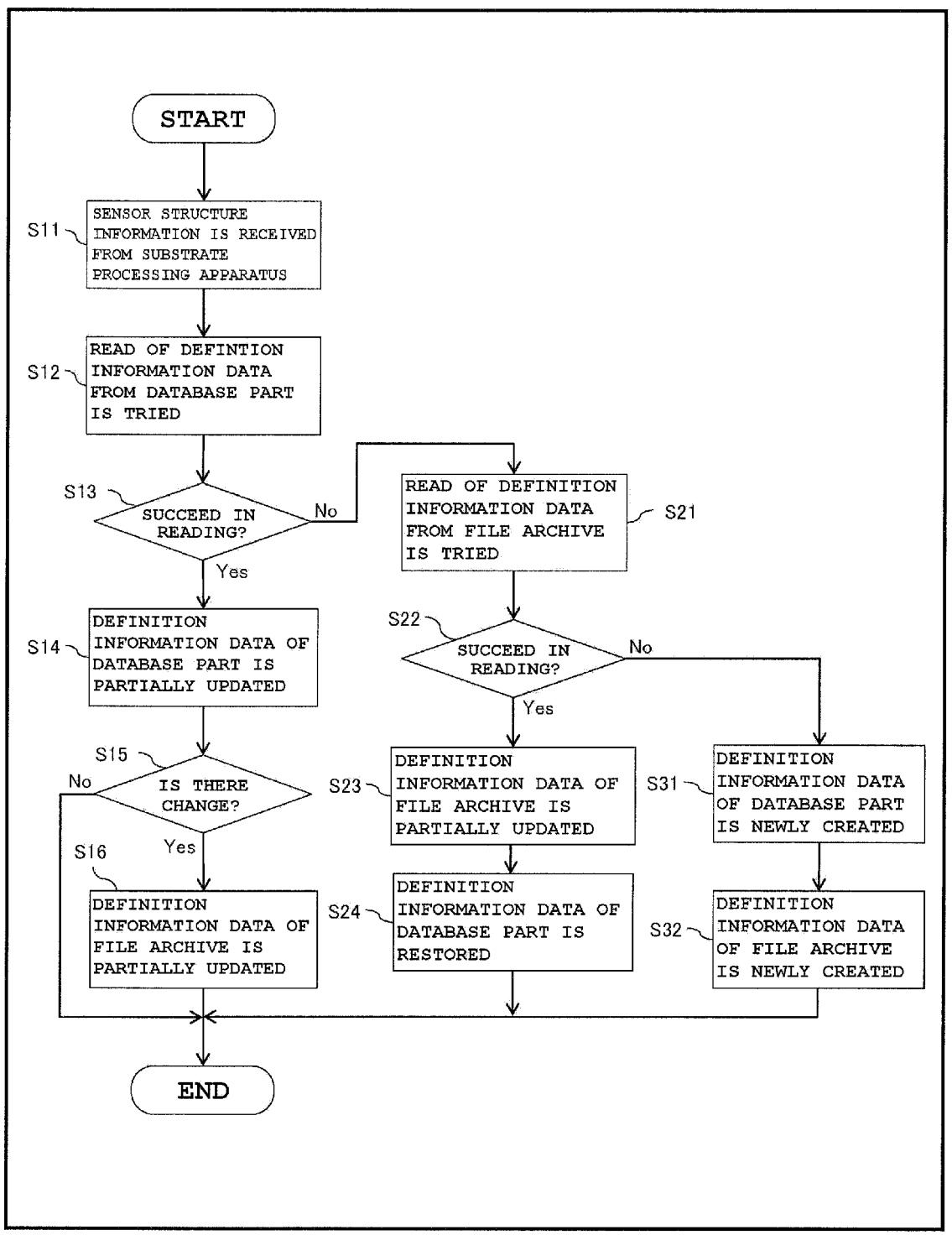
FIG. 12 is a flowchart showing a state that the definition information data is managed by the group managing apparatus according to other embodiment of the present invention.

Next, FIG. 12 shows the operation of the management (update, restoring, new file) of the definition information data by the group managing apparatus 500. The following operation is performed as needed, when the group managing apparatus 500 is started and the change in structure (addition or elimination of the sensor) of the substrate processing apparatus 100 is generated.

(Update Operation of the Definition Information Data)

First, the communication unit 504 provided in the group managing apparatus 500 receives sensor structure information from the substrate processing apparatus 100. Specifically, the communication unit 504 receives from the substrate processing apparatus 100, the Locator for specifying the position of the sensor, the elementType for specifying the type of the sensor, and the information including the Attribute for specifying the attribute of the sensor, and transfers it to the common memory 502. The combination of the Locator, etlementType, and Attribute is respectively received for each sensor of the substrate processing apparatus 100 (S11).

Then, the database part 503a of the group managing apparatus 500 reads the combination of the Locator, elementType, and Attribute from the common memory 502, and applies thereto an arithmetic calculation using a hash function for example, and calculates the sensor ID (hash value). The sensor ID is specifically created for each sensor which is detected by receiving the sensor structure information, for each sensor provided in the substrate processing apparatus 100. Note that the combination of the Locator, elementType, and Attribute is specific to the sensor (unique in at least the substrate processing apparatus 100), and is the information not changed even if addition or elimination of other sensor is generated. Therefore, the sensor ID obtained by the aforementioned method is also unique in at least the substrate processing apparatus 100, and is not changed even if the change in structure (addition or elimination of the sensor) is generated in the substrate processing apparatus 100. An algorithm such as MD-5 and SHA-1 can be utilized for calculating the sensor ID.

Then, the database part 503a tries to read the definition information data to confirm whether or not the definition information data is already stored in the storage part 503 (S12).

In a case of success in reading (in a case of "Yes" in S13, and in a case that existing definition information data is present in the database part 503a, and is not damaged), the database part 503a updates the definition information data stored in the storage part 503, based on the received sensor structure information. For example, when new sensor ID is added (when the sensor ID obtained from the sensor structure information is not present in the read existing definition information data, namely when the sensor is added), the definition information data regarding differential is newly created, and is added to the storage part 503. At this time, Enable flag of the definition information data regarding the added sensor is set to be effective, and the date and time when the definition information data is created for the first time, is inputted into the CreateDate. Further, when the existing sensor ID disappears (when the sensor ID present in the existing definition information data is not present in the sensor ID obtained from the sensor structure information, namely when the sensor is deleted), the Enable flag is changed to be invalidated without deleting the definition information data regarding the deleted sensor, and the date and time of deleting the sensor is inputted into the ObsoleteDate (S14).

When change is generated in the existing definition information data managed by the database part 503a (in a case of "Yes" in S15, and in a case of addition or deletion of the sensor), the file archive part 511 applies similar update processing to the file 503b that constitutes the file archive. The file 503b of this embodiment includes the monitor data, production information data, definition information data, and typical value data. The file archive part 511 applies update processing to the definition information data in the file 503b which is the processing similar to the update processing performed by the database part 503 (S16). Content of the definition information data in the updated file 503b is the same as the content of the definition information data of the database part 503 updated in S14. Thereafter, the group managing apparatus 500 ends the update processing of the definition information data.

Note that if the definition information data in the file 503b is damaged, the definition information data is automatically restored by executing S16. The content of the restored definition information data is the same as the content of the definition information data updated in S14.

When there is no change in the content of the existing definition information data managed by the database part 503a (in a case of "No" in S15, and in a case that there is no change in the structure of the sensor), the file archive part 511 does not update the file 503b. Thereafter, the group managing apparatus 500 ends the update processing of the definition information data.

(Restoring of the Definition Information Data)

In S12, as a result of trying to read the existing definition information data by the database part 503a from the storage part 503, in a case of a failure of reading (in a case of "No" in S13, and in a case that the existing definition information data is not present or is damaged), the database part 503a tries to read the definition information data to confirm whether or not the definition information data is already stored in the file archive (the assembly of the files 503b) (S21).

In a case of the success in reading (in a case of "Yes" in S22, and in a case that the existing definition information data is present in the file archive and is not damaged), the file archive part 511 updates the definition information data stored in the file 503b based on the received sensor structure information. For example, when the new sensor ID is added (when the sensor ID obtained from the sensor structure information is not present in the read existing definition information data, namely when the sensor is added), the definition information data regarding differential is newly created, and is added to the file 503b. At this time, the Enable flag regarding the added sensor is set to be effective, and the date and time of creating the definition information data is inputted into the CreateDate. Further, when the existing sensor ID disappears (when the sensor ID present in the definition information data is not present in the sensor ID obtained from the sensor structure information, namely when the sensor is deleted), the Enable flag is changed to be invalidated without deleting the definition information data regarding the deleted sensor from the file 503b, and the date and time of deleting the sensor is inputted into the ObsoleteDate (S23).

Then, the database part 503a restores the definition information data managed by the database part 503a, based on the definition information data read from the file archive and the received sensor structure information (S24). The content of the restored definition information data is the same as the content of the definition information data in the file 503b which is updated in the aforementioned S23. Thereafter, the group managing apparatus 500 ends the restoring operation of the definition information data.

(Creation of New Definition Information Data)

In S21, as a result of trying to read the definition information data from the file archive (the assembly of the files 503b), in a case of failure in reading (in a case of "No" in S22, namely when the definition information data can't be read from either one of the database part 503a and the file archive), the database part 503a newly creates the definition information data based on the received sensor structure information, and stores it in the storage part 503. At this time, the Enable flag of the newly created definition information data is set to be effective, and the date and time of creating the definition information data for the first time, is inputted into the CreateDate (S31).

Figure 13:
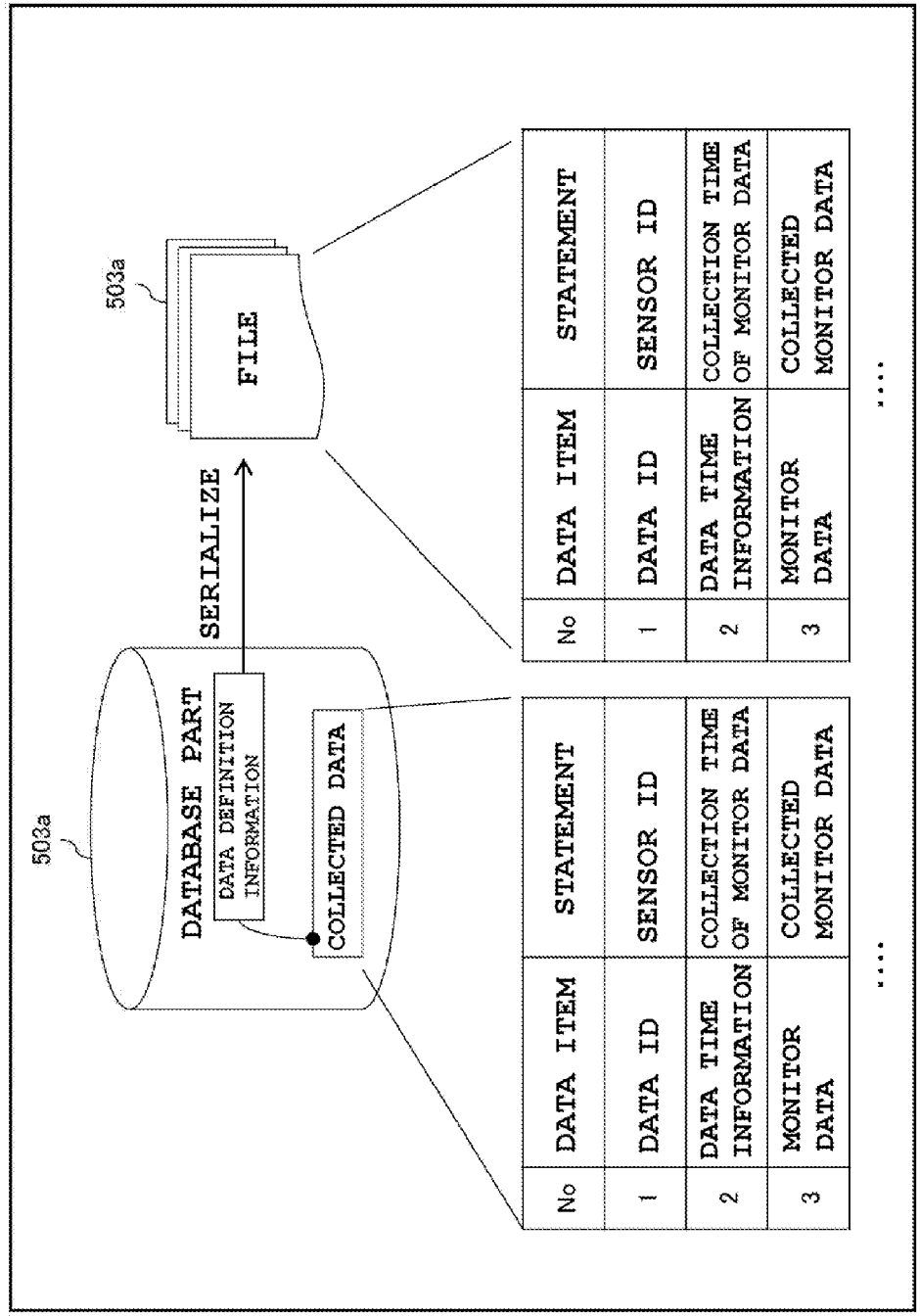
FIG. 13 is a schematic view showing a state that the definition information data is stored in the file archive part by the group managing apparatus according to other embodiment of the present invention.

Further, the file archive part 511 newly creates the definition information data based on the received sensor structure information, and stores it in the file 503b (S32). This state is shown in FIG. 13. The content of the definition information data stored in the file 503b is the same as the content of the definition information data in the file 503b, which is the data newly created in the aforementioned S31. Thereafter, the group managing apparatus 500 ends the creating operation of the definition information data.

(3) Effect of an Embodiment of the Present Invention

According to this embodiment, one or a plurality of effects shown below is exhibited, in addition to the aforementioned effects.

According to this embodiment, the structure of the sensor of the substrate processing apparatus 100 can be easily grasped by managing the definition information data by the group managing apparatus 500. Further, by using the sensor ID as the data ID, analysis focusing on a specific sensor can be easily performed. For example, by searching the monitor data using the data ID (sensor ID), it becomes easy to selectively extract only the monitor data from the prescribed sensor, and selectively delete only the monitor data from the prescribed sensor, out of the enormouos volume of monitor data.

When the sensor ID is used as the data ID, the sensor ID is required to be unique in at least the substrate processing apparatus 100. If there is an overlapped portion in the sensor ID, the creation spot of the monitor data can't be specified, resulting in failure in analysis using the monitor data (such as creation, search, and indication of typical value and the monitor data). Further, the sensor ID is required to be in variable in a case of the change in structure (for example, addition or deletion of the sensor) of the substrate processing apparatus 100. When the change is generated in the sensor ID, mismatch is generated between the sensor ID after change and the data ID (sensor ID) in the file archive, resulting in failure in using the past monitor data, etc.

Meanwhile, according to this embodiment, the sensor ID is calculated by applying the arithmetic calculation using the hush function for example, to the Locator, elementType, and Attribute received from the substrate processing apparatus 100. Wherein, the combination of the Locator, elementType, and Attribute is peculiar (unique) to the sensor, and is the information not changed even if the addition or deletion of other sensor is generated. Therefore, the sensor ID obtained by the aforementioned method is unique in at least the substrate processing apparatus 100, and is invariable even if the change in structure (addition or deletion of the sensor) is generated in the substrate processing apparatus 100. Therefore, according to this embodiment, the above-described problems can be solved.

Further, according to this embodiment, the definition information data is stored and managed by both the database part 503a and the file archive part 512. Then, even if the definition information data stored in the storage part 503 by the database part 503a is damaged, the file archive part 511 is configured to restore the definition information data based on the definition information file stored in the file 503b and the sensor structure information received from the substrate processing apparatus 100. Further similarly, even if the definition information file stored in the file 503b is damaged, the file archive part 512 is configured to restore the damaged definition information data based on the definition information data stored in the storage part 503 of the database part 503a, and the sensor structure information received from the substrate processing apparatus 100. Thus, continuity of the data before and after damage of the definition information data, can be severed.

Further, according to this embodiment, the sensor ID (namely data ID) can be easily obtained based on the Locator, elementType, and Attribute. Therefore, even if the definition information data can't be obtained for certain reasons of a user (such as a semiconductor manufacturer) of the substrate processing system when there is a necessity of urgent data analysis in a case of a breakdown of an apparatus, the monitor data can be easily accessed using the sensor ID.

Further Other Embodiment of the Present Invention

The present invention is not limited to a case that the substrate processing apparatus 100 and the group managing apparatus 500 are disposed on the same floor (in the same clean room). For example, it is also acceptable that the substrate processing apparatus 100 is disposed in the clean room, and the group managing apparatus 500 is disposed in an office (on a floor different from the clean room), and remote control of the progress state of the recipe and the state of the substrate processing apparatus 100 is performed in a distant site.

The present invention can be suitably applied to other substrate processing such as diffusion treatment, annealing, oxidation treatment, nitriding, and lithography, in addition to a film deposition treatment by CVD (Chemical Vapor Deposition) method, ALD (Atomic Layer Deposition), and PVD (Physical Vapor Deposition) method. Further, the present invention can be suitably applied to other substrate processing apparatus such as an annealing treatment apparatus, an oxidation treatment apparatus, a nitriding treatment apparatus, an exposure apparatus, a coating apparatus, a drier, and a heater, in addition to a thin film formation apparatus.

The present invention is not limited to the substrate processing apparatus for processing a wafer substrate such as a semiconductor manufacturing apparatus according to this embodiment, and can be suitably applied to the substrate processing apparatus for processing a glass substrate such as an LCD (Liquid Crystal Display) manufacturing apparatus.

As described above, specific embodiments of the present invention are described. However, the present invention is not limited to the aforementioned embodiments, and can be variously modified in a range not departing from the gist of the present invention.

Preferable Aspect of the Present Invention

Preferable aspects of the present invention will be additionally described hereafter.

According to an aspect of the present invention, there is provided a substrate processing system comprising:

a substrate processing apparatus configured to process a substrate; and a group managing apparatus connected to the substrate processing apparatus, the group managing apparatus comprising:

a communication unit configured to receive monitor data showing a progress state of substrate processing and monitor data showing a state of the substrate processing apparatus, from the substrate processing apparatus;

a database part configured to readably store the monitor data received by the communication unit, in association with production information data;

a file archive part configured to read the monitor data and the production information data from the database part, then create typical value data based on the monitor data, and prepare a file including the monitor data, the production information data, and the typical value data, and readably store this file; and a data searching part configured to receive an input of a prescribed searching condition to search the file, and display the data stored in the file and matching with the searching condition, on a display unit.

Preferably, the file includes a header part, a monitor data part for storing the monitor data, a production information data part for storing the production information data, and a typical value data part for storing the typical value data.

Further preferably, the file archive part is independently configured to eliminate respectively the header part, the monitor data part, the production information data part, and the typical value data part from the file.

Further preferably, the database part readably stores the monitor data received by the communication unit, in association with the production information data, data ID for specifying the monitor data, and data time information showing a creation time of the monitor data, and the file archive part is configured to read the monitor data, the production information data, and the data ID from the database part, then create the typical value data based on the monitor data, and encode at least any one of the monitor data, the production information data, and the typical value data based on the data ID, and prepare the file including the encoded data and the unencoded data and readably store the file in association with the data ID and the data time information.

Further preferably, the data searching part is configured to receive the input of the searching condition including the data ID and the data time information to search the file, and display the data stored in the file and matching with the searching condition, on a display unit.

According to other aspect of the present invention, there is provided a group managing apparatus, which is connected to a substrate processing apparatus for processing a substrate, comprising:

a communication unit configured to receive monitor data showing a progress state of substrate processing or a state of the substrate processing apparatus;

a database part configured to readably store the monitor data received by the communication unit, in association with production information data;

a file archive part configured to read the monitor data and the production information data from the database part, then create typical value data based on the monitor data, and prepare a file including the monitor data, the production information data, and the typical value data, and readably store this file; and a data searching part configured to receive an input of a prescribed searching condition to search the file, and display the data stored in the file and matching with the searching condition, on a display unit.

According to further other aspect of the present invention, there is provided a substrate processing system comprising a substrate processing apparatus for processing a substrate, and a group managing apparatus connected to the substrate processing apparatus, the group managing apparatus comprising:

a communication unit configured to receive monitor data showing a progress state of substrate processing or a state of the substrate processing apparatus, from the substrate processing apparatus;

a database part configured to readably store the monitor data received by the communication unit, in association with production information data and definition information data;

a file archive part configured to read the monitor data from the database part, which is the monitor data associated with the production information data and the definition information data, then create typical value data based on the monitor data, and prepare a file including the monitor data, the production information data, the definition information data, and the typical value data, and readably store this file; and a data searching part configured to receive an input of a prescribed searching condition to search the file, and display the data stored in the file and matching with the searching condition, on a display unit.

Preferably, the file includes a header part, a monitor data part for storing the monitor data, production information data part for storing the production information data, a definition information data part for storing the definition information data, and a typical value data part for storing the typical value data.

Further preferably, the file archive part is independently configured to eliminate respectively the header part, the monitor data part, the production information data part, and the typical value data part from the file.

Further preferably, the database part is configured to readably store the monitor data received by the communication unit, in association with data ID for specifying the production information data, the definition information data, and the monitor data, and data time information showing a creation time of the monitor data, and the file archive part is configured to read the monitor data associated with the production information data, the definition information data, the data ID, and the data time information from the database part, then create the typical value data based on the monitor data, encode at least any one of the monitor data, the production information data, the definition information data, and the typical value data based on the data ID, and prepare the file including the encoded data and the unencoded data, and readably store this file in association with the data ID and the data time information.

Further preferably, the data searching part is configured to receive an input of the searching condition including the data ID and the data time information to search the file, and display the data stored in the file and matching with the searching condition, on a display unit.

According to further other aspect of the present invention, there is provided a group managing apparatus, comprising:

a communication unit configured to receive monitor data showing a progress state of substrate processing or a state of the substrate processing apparatus, from a substrate processing apparatus;

a database part configured to readably store the monitor data received by the communication unit and definition information data;

an archive part configured to read the monitor data associated with the production information data and the definition information data from the database part, then create typical value data based on the monitor data, and prepare a file including the monitor data, the production information data, the definition information data, and the typical value data, and readably store this file; and a data searching part configured to receive an input of a prescribed searching condition to search the file, and display the data stored in the file and matching with the searching condition, on a display unit.

DESCRIPTION OF SIGNS AND NUMERALS

100 Substrate processing apparatus
200 Wafer
500 Group managing apparatus
501 Controller
502 Common memory
503 Storage part
503a Database part
503b File
504 Communication controller (communication unit)
505 Data displayer (display unit)
506 Input unit
511 File archive part
512 Data searching part

The invention claimed is:

1. A substrate processing system, comprising:
a substrate processing apparatus configured to process a substrate based on a recipe defining a processing procedure and a processing condition; and
a managing apparatus connected to the substrate processing apparatus,
the managing apparatus comprising:
an input unit configured to receive an input of a prescribed searching condition;
a storage unit in which monitor data showing at least a progress state of substrate processing of the substrate processing apparatus or a state of the substrate processing apparatus is stored;
a display unit configured to display data; and
a controller configured to readably store the monitor data in the storage unit, in association with production information data containing at least recipe specifying information for specifying a recipe executed by the substrate processing apparatus when the monitor data is created;
wherein
the storage unit has:
a file assembly part in which a file containing the recipe is readably stored; and
the controller has:
a database part configured to readably store the monitor data in the storage unit;
a file archive part configured to read the monitor data from the storage unit, then create typical value data showing typical value of the monitor data based on the read monitor data, prepare the file including the monitor data, the production information data, and the typical value data, and readably store the prepared file in the file assembly part, in association with data ID for specifying the monitor data and data time information showing a creation time of the monitor data; and
a data searching part configured to search the file matching with the prescribed searching condition from the file assembly part when the input unit receives the input of the prescribed searching condition containing the data ID and the data time information, and display at least any one data of the monitor data, the production information data and the typical value data, storing in the file matching with the prescribed searching condition, on the display unit, and
wherein
the file archive part encodes at least any one of the monitor data, the production information data and the typical value data, and prepare the file.

2. A managing apparatus comprising:
an input unit configured to receive an input of a prescribed searching condition;
a storage unit in which monitor data showing at least a progress state of substrate processing of a substrate processing apparatus to process a substrate based on a recipe defining a processing procedure and a processing condition or a state of the substrate processing apparatus is stored;
a display unit configured to display data; and
a controller configured to readably store the monitor data in the storage unit, in association with production information data containing at least recipe specifying information for specifying a recipe executed by the substrate processing apparatus when the monitor data is created;
wherein
the storage unit has:
a file assembly part in which a file containing the recipe is readably stored; and
the controller has:
a database part configured to readably store the monitor data in the storage unit;
a file archive part configured to read the monitor data from the storage unit, then create typical value data showing typical value of the monitor data based on the read monitor data, prepare the file including the monitor data, the production information data, and the typical value data, and readably store the prepared file in the file assembly part, in association with data ID for specifying the monitor data and data time information showing a creation time of the monitor data; and
a data searching part configured to search the file matching with the prescribed searching condition from the file assembly part when the input unit receives the input of the prescribed searching condition containing the data ID and the data time information, and display at least any one data of the monitor data, the production information data and the typical value data, storing in the file matching with the prescribed searching condition, on the display unit, and
wherein
the file archive part encodes at least any one of the monitor data, the production information data and the typical value data, and prepare the file.

3. The managing apparatus according to claim 2, wherein the file has a header part, a monitor data part for storing the monitor data, a production information data part for storing the production information data, and a typical value data part for storing the typical value data.

4. A non-transitory computer-readable recording medium storing a program casing a computer to function as:
an input unit configured to receive an input of a prescribed searching condition;
a storage unit in which monitor data showing at least a progress state of substrate processing of a substrate processing apparatus to process a substrate based on a recipe defining a processing procedure and a processing condition or a state of the substrate processing apparatus is stored;

a display unit configured to display data;

a controller configured to readably store the monitor data in the storage unit, in association with production information data containing at least recipe specifying information for specifying a recipe executed by the substrate processing apparatus when the monitor data is created;

a file assembly part which is provided with the storage unit and in which a file containing the recipe is readably stored;

a database part which is provided with the controller and is configured to readably store the monitor data in the storage unit;

a file archive part which is provided with the controller and is configured to read the monitor data from the storage unit, then create typical value data showing typical value of the monitor data based on the read monitor data prepare file including the monitor data, the production information data, and the typical value data, and readably store the prepared file in the file assembly part, in association with data ID for specifying the monitor data and data time information showing a creation time of the monitor data, and to encode at least any one of the monitor data, the production information data and the typical value data, and prepare the file; and a data searching part which is provided with the controller and is configured to search the file matching with the prescribed searching condition from the file assembly part when the input unit receives the input of the prescribed searching condition containing the data ID and the data time information, and display at least any one data of the monitor data, the production information data and the typical value data, storing in the file matching with the prescribed searching condition, on the display unit.

5. The managing apparatus according to claim 2, wherein the controller is configured to prepare the file including encoded data of at least any one of the monitor data, the production information data and the typical value data, and unencoded data of at least any one of the monitor data, the production information data and the typical value data.

6. The managing apparatus according to claim 2, wherein the controller is configured to independently eliminate each of the monitor data, the production information data and the typical value data.

7. The managing apparatus according to claim 3, wherein the controller is configured to independently eliminate each of the monitor data part, the production information data part and the typical value data part.

8. The managing apparatus according to claim 2, wherein the database part is configured to readably store the monitor data in association with each of the production information data, data ID specifying the monitor data and data time information showing a creation time of the monitor data.

9. The managing apparatus according to claim 2, wherein the file archive part is configured to prepare the file including encoded data of at least any one of the monitor data, the production information data and the typical value data and unencoded data of at least any one of the monitor data, the production information data and the typical value data.

10. The managing apparatus according to claim 3, wherein the header part includes at least one area selected from a "file version" area for storing version information of the file, a "program version" area for storing the version information of a file archive program, a "monitor data part start pointer" area for storing pointer information showing a start position of a monitor data part from a head of the file, a "production information data part start pointer" area for storing pointer information showing a start position of a production information data part from the head of the file, a "typical value data part start pointer" area for storing pointer information showing a start position of a typical value data part from the head of the file, a "typical value data part data length" area for storing information regarding a data length of the typical value data part, and a spare area.

11. The managing apparatus according to claim 3, wherein the monitor data part includes at least one area selected from a "header part" area for storing the information specific to monitor data, data ID for specifying the monitor data, an "index part" area for storing an encoding information of the monitor data and a "data part" area for storing the monitor data added with the data time information.

12. The managing apparatus according to claim 3, wherein the production information data part includes at least one information selected from apparatus specifying information specifying the substrate processing apparatus which is a creation source of the monitor data, recipe specifying information specifying a recipe executed by the substrate processing apparatus when the monitor data is created, process specifying information specifying a substrate processing process executed by the substrate processing apparatus when the monitor data is created, information specifying a value of a film thickness and a transfer position of the substrate, data ID specifying the production information data, and encoding information showing whether or not the object should be encoded.

13. The managing apparatus according to claim 3, wherein the typical value data part includes at least one information selected from typical value name information showing a name of the typical value, typical value extracting condition information showing a calculating condition of the typical value, typical value extracting section information showing a section extracting the typical value, typical value extracting time information showing start date and end date extracting the typical value, typical value information showing the typical value itself, typical value creating date information showing the date and time of creating the typical value, typical value calculating time information showing the time required for calculating the typical value, data point information showing the number of data points used for calculating the typical value, typical value number information which is the number for uniquely identifying the typical value when a plurality of same typical values exist in the same file, data ID specifying typical value data, and encoding information showing whether or not the object should be encoded.

* * * * *